United States Patent
Kumagai

(10) Patent No.: US 10,522,672 B2
(45) Date of Patent: Dec. 31, 2019

(54) SEMICONDUCTOR DEVICE

(71) Applicant: Fuji Electric Co., Ltd., Kanagawa (JP)

(72) Inventor: Naoki Kumagai, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/057,365

(22) Filed: Aug. 7, 2018

(65) Prior Publication Data

US 2019/0081170 A1  Mar. 14, 2019

(30) Foreign Application Priority Data

Sep. 13, 2017 (JP) .................................. 2017-176093

(51) Int. Cl.
*H01L 29/78* (2006.01)
*H01L 27/085* (2006.01)
(Continued)

(52) U.S. Cl.
CPC .... *H01L 29/7806* (2013.01); *H01L 21/02529* (2013.01); *H01L 21/0465* (2013.01); *H01L 21/8258* (2013.01); *H01L 27/085* (2013.01); *H01L 29/0696* (2013.01); *H01L 29/1095* (2013.01); *H01L 29/167* (2013.01); *H01L 29/4236* (2013.01); *H01L 29/4916* (2013.01); *H01L 29/66734* (2013.01); *H01L 29/7811* (2013.01); *H01L 29/7813* (2013.01); *H01L 29/063* (2013.01); *H01L 29/0619* (2013.01);
(Continued)

(58) Field of Classification Search
CPC ............. H01L 29/7806; H01L 29/0696; H01L 27/085; H01L 29/4916; H01L 29/4236; H01L 29/1608; H01L 29/7813; H01L 21/8258

USPC .......... 257/331, 332, 333, 334, 77; 438/105, 438/270, 271, 588.587
See application file for complete search history.

(56) References Cited

U.S. PATENT DOCUMENTS

2012/0286290 A1* 11/2012 Uchida ............... H01L 29/7828
257/77
2014/0231828 A1   8/2014 Horikawa et al.

FOREIGN PATENT DOCUMENTS

JP           4100680 B2    6/2008
JP         2012-146932 A    8/2012
(Continued)

OTHER PUBLICATIONS

J.D. Caldwell, et al., "On the driving force for recombination-induced stacking fault motion in 4H-SiC," Journal of Applied Physics (USA), American Institute of Physics (AIP) Publishing, 2010, vol. 108, p. 044503 (Mentioned in paragraph Nos. 12 and 25 of the as-filed specification.).

*Primary Examiner* — Thinh T Nguyen
(74) *Attorney, Agent, or Firm* — Chen Yoshimura LLP

(57) ABSTRACT

A semiconductor substrate made of silicon carbide is provided with first and second cells having a MOS gate structure. The first cell is a normal MOSFET cell. In the second cell, a gate electrode is directly connected to a source electrode and has a potential fixed to a potential of the source electrode. A thickness of a gate insulating film of the second cell is set to be less than a thickness of a gate insulating film of a first cell so that the surface potential of a p-type channel region of the second cell becomes lower than the surface potential of a p-type channel region of the first cell during a negative bias to the gate electrode of the first cell.

13 Claims, 31 Drawing Sheets

(51) Int. Cl.
  *H01L 29/06* (2006.01)
  *H01L 29/49* (2006.01)
  *H01L 29/423* (2006.01)
  *H01L 29/66* (2006.01)
  *H01L 21/8258* (2006.01)
  *H01L 21/02* (2006.01)
  *H01L 21/04* (2006.01)
  *H01L 29/167* (2006.01)
  *H01L 29/10* (2006.01)
  *H01L 29/40* (2006.01)
  *H01L 29/16* (2006.01)

(52) U.S. Cl.
  CPC ........ *H01L 29/1608* (2013.01); *H01L 29/402* (2013.01)

(56) References Cited

FOREIGN PATENT DOCUMENTS

JP 2013-232574 A 11/2013
JP 5501539 B1 5/2014

* cited by examiner

SEMICONDUCTOR DEVICE

BACKGROUND OF THE INVENTION

Technical Field

The present invention relates to a semiconductor device.

Background Art

Conventionally, there is known a single phase (1 phase) inverter having a full bridge circuit configuration that converts direct-current voltage into alternating-current voltage via ON/OFF of four switching elements. An example of an ordinary single-phase inverter circuit configuration will be described in which a MOSFET (metal oxide semiconductor field effect transistor) is used as a switching element. FIG. 29 is a circuit diagram showing the circuit configuration of an ordinary single-phase inverter.

The single-phase inverter shown in FIG. 29 is a full bridge circuit configuration made of four MOSFETs 201a to 201d. The drains of the MOSFETs 201a, 201b on the high side (power supply line side) are connected to the positive electrode side of a direct-current (DC) power supply 203, and the sources are respectively connected to the drains of the MOSFETs 201c, 201d on the low side (ground side). The sources of the low side MOSFETs 201c, 201d are connected to the negative electrode side of the DC power supply 203.

An inductive load 204 having an inductance component is connected between the source of the MOSFET 201a and the drain of the MOSFET 201c and between the source of the MOSFET 201b and the drain of the MOSFET 201d. Gate driver circuits (GDs) 202a to 202d that drive the gates of the respective MOSFETs 201a to 201d are connected to the respective gates of the MOSFETs 201a to 201d. Diodes 205a to 205d are respectively connected in parallel to the MOSFETs 201a to 201d.

In the single-phase inverter shown in FIG. 29, the output voltage is controlled by varying a width of an ON pulse (the ON time Ton of the pulse: see FIG. 31) through alternately causing diagonally-placed MOSFETs 201a, 201d and MOSFETs 201c, 201b to become conductive. During conduction of the MOSFET 201a and MOSFET 201d, as shown by the solid arrowed line, current Ia flows to the inductive load 204 via a path 211 from the positive electrode side of the DC power supply 203, passing through the MOSFET 201a, conductive load 204, and MOSFET 201d, toward the negative electrode side of the DC power supply 203.

If the MOSFETs 201a, 201d are turned OFF when the current Ia is flowing to the inductive load 204 through this path 211, the diodes 205c, 20b become conductive to cause current commutation—i.e., here, changing the current path to and from the inductive load 204—in order to continuously allow the current of the inductive load 204 to flow. Due to this, as shown by the dashed arrow, the current flowing through the inductive load 204 becomes current Ib that flows through the diodes 205c, 205b via a path 212 from the negative electrode side of the DC power supply 203, passing through the diode 205c, inductive load 204, and diode 205b, and going toward the positive electrode side of the DC power supply 203.

When using a MOSFET made of a silicon (Si) semiconductor material as the MOSFETs 201a to 201d (hereinafter, Si-MOSFET), there are cases to use a parasitic pn junction diode (body diode) formed at the pn junction of the base region and drift region of the Si-MOSFET as the diodes 205a to 205d. On the other hand, when using conventional power MOSFETs (hereinafter, SiC-MOSFET) made of a silicon carbide (SiC) semiconductor material as the MOSFETs 201a to 201d, the following problems occur.

The structure of a conventional SiC-MOSFET will be described. FIG. 30 is a cross-sectional view showing one example of the structure of a conventional SiC-MOSFET. FIG. 30 shows a single unit cell (a configurational unit of an element) of a conventional SiC-MOSFET. The SiC-MOSFET shown in FIG. 30 has a MOS gate on the front surface (the surface on an $n^-$ epitaxial layer 222a) side of a semiconductor substrate 220. The semiconductor substrate 220 is formed by laminating the $n^-$ epitaxial layer 222a, which serves as an $n^-$ drift region 222, on an $n^+$ starting substrate ($n^+$ drain region) 221 made of silicon carbide.

A plurality of p-type channel regions 223 are selectively provided separated from one another on the surface layer of the $n^-$ epitaxial layer 222a (the surface layer of the front surface of the semiconductor substrate 220, which is the side opposite to the $n^+$ starting substrate 221 side). $P^+$ base regions 224 are selectively provided inside the $n^-$ epitaxial layer 222a at positions deeper than the p-type channel regions 223 from the front surface of the semiconductor substrate 220. The $p^+$ base regions 224 face and contact the p-type channel regions 223 in the depth direction. The depth direction is the direction going from the front surface of the semiconductor substrate 220 to the rear surface.

The portion of the $n^-$ epitaxial layer 222a except for the p-type channel regions 223 and $p^+$ base regions 224 is the $n^-$ drift region 222. The reference character 227 is a gate insulating film, 228 is a gate electrode, 229 is an interlayer insulating film, 231 is a source electrode, and 233 is a drain electrode. Reference character 230 is contact electrodes (hereinafter, ohmic contact electrode) that each make ohmic contact with an $n^+$ source region 225 and a $p^{++}$ contact region 226. The reference character 232 is an ohmic contact electrode that makes ohmic contact with the $n^+$ drain region ($n^+$ starting substrate 221).

When forward current is caused to flow to the parasitic pn junction diode (body diode) formed at the pn junction of the $n^-$ drift region 222 and the p-type channel region 223 and $p^+$ base region 224 of the SiC-MOSFET shown in FIG. 30, it is known that a problem occurs where the ON resistance of the SiC-MOSFET increases. Due to this, when using an SiC-MOSFET as the MOSFETs 201a to 201d of FIG. 29, it is not preferable to use body diodes of an SiC-MOSFET as the diodes 205a to 205d of FIG. 29 and to cause forward current to flow through the body diodes.

The reason that ON resistance of the SiC-MOSFET increases when forward current is caused to flow to the body diode of the SiC-MOSFET is reported as follows. In an SiC-MOSFET, if forward current flows to the body diode, stacking faults will grow originating at dislocations within the silicon carbide crystals due to the recombination energy between the majority carriers and minority carriers when conductivity modulation occurs. Due to these stacking faults, there is an increase in the areas where the main current has difficulty flowing to the current path of the SiC-MOSFET, and thus the ON resistance of the SiC-MOSFET increases (for example, see Non-patent Document 1 below).

An example of dislocations acting as the source of stacking faults is basal plane dislocations, which exist within the $n^+$ starting substrate 221 in a large amount and are propagated from the $n^+$ starting substrate 221 to the $n^-$ epitaxial layer 222a in the course of epitaxial growth of the $n^-$ epitaxial layer 222a on the $n^+$ starting substrate 221. The basal plane dislocation in the $n^+$ starting substrate 221 will become a dislocation that has little adverse effect on the ON resistance of the SiC-MOSFET in the course of epitaxial growth of the n⁻ epitaxial layer 222a, but a portion of the basal plane dislocation propagated from the n⁺ starting substrate 221 will remain in the n-epitaxial layer 222a.

In this manner, the portion of the basal plane dislocations remaining in the n⁻ epitaxial layer 222a during the epitaxial growth process of the n⁻ epitaxial layer 222a on the n⁺ starting substrate 221 is considered to be one of the causes of increased ON resistance of the SiC-MOSFET. However, there are still aspects that are unclear about the mechanism behind the increase in ON resistance of the SiC-MOSFET. For example, there have also been reports on faults generated in the epitaxial growth process of the n⁻ epitaxial layer 222a on the n⁺ starting substrate 221, the growth of stacking faults from a portion ion-implanted with a high impurity concentration, etc.

There has been a proposal for a silicon carbide semiconductor device that suppresses the growth of stacking faults, in which a current limiting region is formed along the step flow growth direction of an epitaxial layer (e.g., refer to Patent Document 1 below (paragraph)). There is also a proposal for a silicon carbide semiconductor device where stacking faults are reduced, in which a direction in which a surface of a mesa-shaped p-type anode emitter layer extends in the lengthwise direction is inclined at a 60° angle from an off direction, which is the <11-20> direction (e.g., see Patent Document 2 below (paragraph [0040], FIGS. 1, 12, and 14).

Furthermore, there has been a proposal for a silicon carbide semiconductor device where the growth of stacking faults are suppressed, in which an n-type epitaxial layer and a p-type semiconductor region laminated in this order on a starting substrate made of silicon carbide are divided into a plurality of island-shaped regions by a fault stopping region that reaches from the surface of the p-type semiconductor region to an interface between the n-type epitaxial layer and the starting substrate (e.g., see Patent Document 3 below (paragraph [0029], FIG. 1)). The fault stopping region of Patent Document 3 below is made of an insulator such as silicon oxide and functions to stop the growth of stacking faults.

As described above, a device has been proposed in which the growth of stacking faults occurring when forward current is caused to flow to a body diode is suppressed in a MOSFET using a semiconductor material with a wider band gap (forbidden bandwidth) than silicon (hereinafter, wide bandgap semiconductor).

Furthermore, when using an SiC-MOSFET as the MOSFETs 201a to 201d of FIG. 29, there is the following method for preventing forward current from flowing to the body diode of the SiC-MOSFET. During current commutation of the single-phase inverter shown in FIG. 29, the MOSFETs 201c, 201b turning ON (so-called synchronous rectification mode) causes the current Ib (hereinafter, referred to as reverse current) flowing during current commutation to flow to the MOSFETs 201c, 201b in the reverse direction as compared to the normal direction during ON time. Due to this, it is possible to prevent forward current from flowing to the body diode of the MOSFETs 201c, 201b.

However, if the MOSFETs 201a, 201c or the MOSFETs 201b, 201d of the upper and lower arms turn ON at the same time (so-called arm short circuiting), the DC power supply 203 will short-circuit. Thus, as shown in FIG. 31, there is a period (so-called deadtime) T1 when the MOSFETs 201a, 201c or MOSFETs 201b, 201d of the upper and lower arms turn OFF at the same time, and during this deadtime T1, forward current flows to the body diode of the MOSFETs 201a to 201d. FIG. 31 is a time chart for explaining the ON/OFF operation of the MOSFETs of the single-phase inverter in FIG. 29.

In order for forward current not to flow to the body diode of the MOSFETs 201a to 201d, the diodes 205a to 205d are connected in parallel to the respective MOSFETs 201a to 201d, as shown in FIG. 29. These diodes 205a to 205d can be high withstand voltage Schottky barrier diodes with silicon carbide as the semiconductor material, which has a dielectric breakdown electric field strength that is 10 times that of silicon. In such case, loss during turn ON and recovery loss occurring during reverse recovery of the diodes are reduced.

However, if the forward voltage of the diodes 205a to 205d becomes greater than or equal to the built-in voltage of the MOSFETs 201a to 201d (the built-in voltage when using silicon carbide as the semiconductor material is approximately 2.3 V), then forward current will flow to the body diode of the MOSFETs 201a to 201d. Due to this, it is necessary to reduce the forward drop voltage (Vf) of the diodes 205a to 205d, which prompts an increase in cost due to an increase in chip area of the diodes 205a to 205d.

There is also a proposal, in a conventional SiC-MOSFET, to provide an n-type channel region so as to straddle the surfaces of an n⁺ source region and p-type body region, and to provide a gate electrode on this n-type channel region with a gate insulating film interposed therebetween (e.g., see Patent Document 4 below (paragraphs [0016]-[0017], [0020])). In Patent Document 4 below, during current return, forward current is not allowed to flow to the body diode of the SiC-MOSFET, but rather the SiC-MOSFET functions as a unipolar diode that causes a reverse current to flow to the SiC-MOSFET via the n-channel region.

Patent Document 4 below (paragraph [0091]) also discloses an SiC-MOSFET configured such that limits on the ON current due to a gate electrode do not occur by connecting the gate electrode of a portion of unit cells to a fixed potential such as the potential of the source electrode in order to make the potential of this unit cell gate electrode substantially the same as the fixed potential. In this SiC-MOSFET, when a negative bias is applied to the gate electrode in order to prevent erroneous turning ON caused by dV/dt surges or the like, reverse current is caused to flow through the n-channel region to the portion of unit cells in which the gate electrode is connected to a fixed potential such as the potential of the source electrode.

RELATED ART DOCUMENTS

Patent Documents

Patent Document 1: Japanese Patent Application Laid-Open Publication No. 2013-232574
Patent Document 1: Japanese Patent Application Laid-Open Publication No. 2012-146932
Patent Document 3: Japanese Patent No. 4100680
Patent Document 4: Japanese Patent No. 5501539

Non-Patent Document

Non-Patent Document 1: J. D. Caldwell, et al., *On the driving force for recombination-induced stacking fault motion in 4H-SiC*, Journal of Applied Physics (USA), American Institute of Physics (AIP) Publishing, 2010, volume 108, p. 044503.

SUMMARY OF THE INVENTION

However, dislocations etc. acting as the source for stacking faults can be reduced by optimization of the conditions for silicon carbide crystal growth or the like, as disclosed in Patent Documents 1-3 above, but are difficult to completely eliminate. The shape of stacking faults has been confirmed by photoluminescence (PL) and the like, and it is known that there are stacking faults with triangular shapes, belt shapes, etc. Among these stacking faults, the belt-shaped stacking faults have a large area, and thus, even if only one belt-shaped stacking fault exists inside a silicon carbide crystal, there are large adverse effects on the ON resistance of the SiC-MOSFET.

Furthermore, it is necessary to cause the current Ib to flow at the same magnitude as the current Ia flowing during current commutation and before current commutation in the single-phase inverter (FIG. 29). Due to this, in Patent Document 4, it is necessary to make approximately ⅓ of unit cells of the MOSFET into unit cells in which the gate electrode is fixed to the potential of the source electrode, thus reducing the real active region (MOSFET current capability) to approximately ⅔. Thus, in order to cause currents Ia, Ib of the same magnitude before and after current commutation to flow, it is necessary to make the chip size larger and increase the number of unit cells operating as normal MOSFET cells, but this prompts an increase in costs due to the increase in chip size.

Accordingly, the present invention is directed to a scheme that substantially obviates one or more of the problems due to limitations and disadvantages of the related art. In order to eliminate the problems of the conventional technology described above, the present invention, aims at providing a semiconductor device that uses, as the semiconductor material, a semiconductor with a wider bandgap than silicon, that can suppress decreases in area of the effective region of the active region, and that can suppress the growth of stacking faults.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device including a semiconductor substrate of a first conductive type made of a semiconductor having a bandgap wider than silicon; a drift region of the first conductive type, made of said semiconductor, over the semiconductor substrate; one or more first MOS gate structures at or adjacent to a top surface of the drift region, each of the first MOS gate structures including: a gate electrode, a gate insulating film, a source region of the first conductivity type, made of said semiconductor, and a channel region of a second conductivity type, made of said semiconductor, the channel region being disposed across the gate electrode with the gate insulating film interposed therebetween, and being in contact with the source region on one end and the drift region on another end alongside the gate insulating film, so that when a potential difference between the gate electrode and the channel region exceeds a threshold voltage, an inversion region would be created in the channel region to form a channel between the source region and the drift region; one or more second MOS gate structures in the top surface of the drift region, each of the second MOS gate structures including: a gate electrode, a gate insulating film, a source region of the first conductivity type, made of said semiconductor, and a channel region of a second conductivity type, made of said semiconductor, the channel region being disposed across the gate electrode with the gate insulating film interposed therebetween, and being in contact with the source region on one end and the drift region on another end alongside the gate insulating film, so that when a potential difference between the gate electrode and the channel region exceeds a threshold voltage, an inversion region would be created in the channel region to form a channel between the source region and the drift region; a source electrode over the first and second MOS gate structures, the source electrode being electrically connected to the source region of each of the first and second MOS gate structures; and a drain electrode under the semiconductor substrate, wherein the first MOS gate structures and the second MOS gate structures are arranged side-by-side in a plan view and when the first and second MOS gate structures are both provided in a plurality, a group consisting of a prescribed number of the first MOS gate structures and a prescribed number of the second MOS gate structures that are arranged in a prescribed arrangement is repeatedly arranged in the plan view, and wherein at least one of physical properties of the respective gate electrodes, the respective gate insulating films, and the respective channel regions of the first and second MOS structures is made different between the first MOS structure and the second MOS structure such that the threshold voltage of each of the first MOS gate structures is greater than the threshold voltage of each of the second MOS gate structures.

In the above-mentioned semiconductor device of the present invention, a thickness of the gate insulating film of the second MOS gate structure may be less than a thickness of the gate insulating film of the first MOS gate structure.

In the above-mentioned semiconductor device of the present invention, at least a portion of the gate insulating film of the second MOS structure may have a higher dielectric constant than the gate insulating film of the first MOS gate structure.

In the above-mentioned semiconductor device of the present invention, the first conductivity type may be n-type, the second conductivity type may be p-type, and a material of the gate electrode of the second MOS gate structure may have a higher Fermi level than a material of the gate electrode of the first MOS gate structure.

In the above-mentioned semiconductor device of the present invention, the material of the gate electrode of the first MOS gate structure may be p-type polysilicon, and the material of the gate electrode of the second MOS gate structure may be n-type polysilicon.

In the above-mentioned semiconductor device of the present invention, the first conductivity type may be p-type, the second conductivity type may be n-type, and the material of the gate electrode of the second MOS gate structure may have a lower Fermi level than the material of the gate electrode of the first MOS gate structure.

In the above-mentioned semiconductor device of the present invention, the material of the gate electrode of the first MOS gate structure may be n-type polysilicon, and the material of the gate electrode of the second MOS gate structure may be p-type polysilicon.

In the above-mentioned semiconductor device of the present invention, each of the first and second MOS gate structures may further include a JFET region that is a portion of the drift region, each of the first and second MOS gate structures may be a planar gate structure in which the source region, the channel region, and said JFET region of the drift region are arranged laterally, and the gate electrode is disposed laterally via the gate insulating film over the source region, the channel region and said JFET region of the drift region, and a width of said JFET region of the second MOS gate structure may be narrower than a width of said JFET region of the first MOS gate structure.

In the above-mentioned semiconductor device of the present invention, each of the first and second MOS gate structures may be a trench gate structure in which the gate insulating film and the gate electrode are disposed in a trench that extends vertically from a top towards a bottom, and the source region, the channel region, and said JFET region of the drift region are arranged vertically alongside the trench, each of the first and second MOS gate structures may further include: a first semiconductor region of the second conductivity type that is selectively disposed inside the drift region so as to be separated from the channel region and surround a bottom surface of the trench; a second semiconductor region of the second conductivity type, selectively disposed inside the drift region, between the adjacent trenches, and contacting the channel region; and a JFET region that is a portion of the drift region interposed between the first semiconductor region and the second semiconductor region, and a width of said JFET region of the second MOS gate structure may be narrower than a width of said JFET region of the first MOS gate structure.

In the above-mentioned semiconductor device of the present invention, the gate electrode of each of the second MOS gate structures may be connected to the source electrode of the second MOS gate structure to have a potential fixed to a potential of the source electrode.

In the above-mentioned semiconductor device of the present invention, each of the first and second MOS gate structures may further include a contact region of the second conductivity type that is selectively disposed in the channel region so as to contact the source region and has a higher impurity concentration than the channel region, and the contact region may be in contact with the source electrode, and a contact area between the source electrode and the contact region may be less than or equal to 1/10 of a contact area between the source electrode and the source region.

In the above-mentioned semiconductor device of the present invention, each of the first and second MOS gate structures may further include another electrode that forms a Schottky junction with the channel region, and the source electrode may form an ohmic junction with the contact region.

In the above-mentioned semiconductor device of the present invention, a plurality of the first and second MOS gate structures may be arranged in parallel in a growth direction of stacking faults in said semiconductor.

The semiconductor device according to the present invention uses, as the semiconductor material thereof, a semiconductor with a wider bandgap than silicon, and can cause a large amount of reverse current to flow to a second cell during reverse conduction. Therefore, it is possible to suppress a decrease in area of the effective region of the active region by an amount corresponding to the improvement of reverse current capability of the second cell. It is also possible to suppress carrier recombination, which is a cause for the growth of stacking faults during reverse conduction, and thus it is possible to suppress the growth of stacking faults, and to suppress an increase in ON resistance.

It is to be understood that both the foregoing general description and the following detailed description are exemplary and explanatory, and are intended to provide further explanation of the invention as claimed.

DETAILED DESCRIPTION OF EMBODIMENTS

Figure 1:
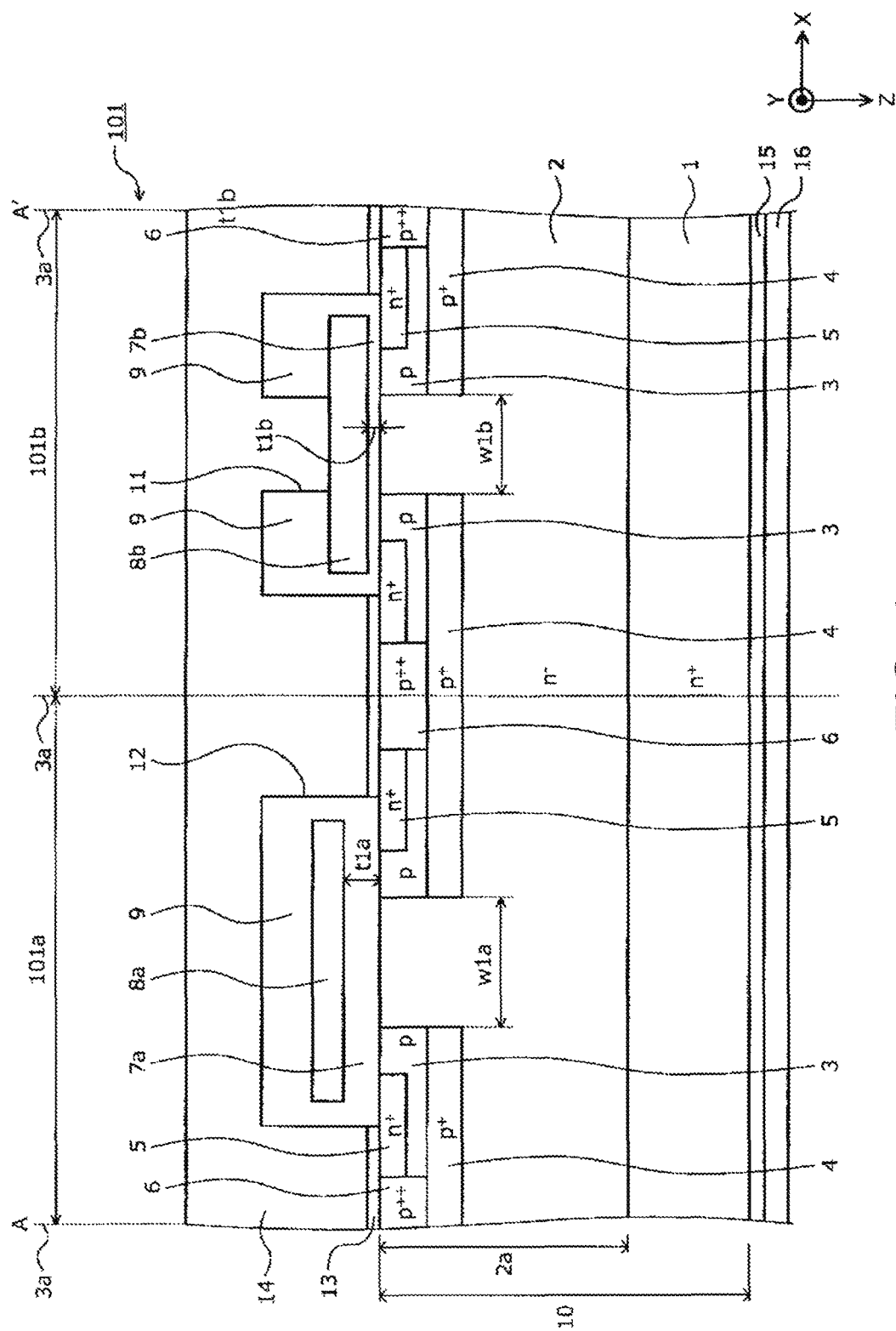
FIG. 1 is a cross-sectional view showing main parts of a semiconductor device of Embodiment 1.

Suitable embodiments of a semiconductor device and a method of manufacturing a semiconductor device according to the present invention will be explained in detail below with reference to the attached drawings. In the present specification and attached drawings, "n" or "p" that is added in layers or regions signify that the majority carriers in those layers or regions are electrons or holes, respectively. The "+" or "−" attached to the "n" or "p" respectively signify that those layers or regions have a higher impurity concentration or a lower impurity concentration than layers or regions without these symbols. In the explanation of the embodiments below and the attached drawings, the same reference characters are attached to similar configurations and repetitive descriptions will be omitted.

Embodiment 1

A semiconductor device of Embodiment 1 is formed using a semiconductor with a wider bandgap than silicon (Si) (wide bandgap semiconductor). An example of the structure of the semiconductor device of Embodiment 1 will be described in which the wide bandgap semiconductor is silicon carbide (SiC), for example. FIG. 1 is a cross-sectional view showing main parts of the semiconductor device of Embodiment 1. FIG. 1 shows the cross-sectional structure of the cutting line A-A' in FIG. 2, which will be described later. Specifically, FIG. 1 shows one first cell 101a, and one second cell 101b adjacent to the first cell 101a (the same applies to FIGS. 5, 6, 8, and 9).

The semiconductor device of Embodiment 1 shown in FIG. 1 is a planar gate structure SiC-MOSFET in which the unit cells (hereinafter, first and second cells) 101a, 101b of the MOSFET are arranged in a prescribed layout in an active region 101 of a semiconductor substrate (semiconductor chip) 10 made of silicon carbide. The semiconductor substrate 10 is formed by epitaxially growing an n⁻ silicon carbide layer 2a, which serves as an n⁻ drift region 2, on the front surface of an n⁺ starting substrate 1 made of silicon carbide. The active region 101 is the region where main current flows when the semiconductor device is ON. The surrounding of the active region 101 is covered by an edge termination region 102 (not shown in FIG. 1; see FIG. 2).

The edge termination region 102 is between the active region 101 and the chip (semiconductor substrate 10) side surfaces and reduces the electric field on the substrate front surface (front surface of the semiconductor substrate 10) side of the n⁻ drift region 2 to maintain a withstand voltage. The edge termination region 102 has a p-type region forming a junction termination extension (JTE) or guard ring, for example, or a withstand-voltage structure such as a field plate or RESURF. Withstand voltage is the maximum voltage at which the semiconductor device will not malfunction or breakdown.

The first and second cells 101a, 101b have MOS gates of differing potentials. At least one each of the first and second cells 101a, 101b is provided. The MOS gate of the first cell 101a is made of p-type channel regions 3, p⁺ base regions 4, n⁺ source regions 5, p⁺⁺ contact regions 6, a gate insulating film 7a, and a gate electrode 8a. The MOS gate of the second cell 101b is made of p-type channel regions 3, p⁺ base regions 4, n⁺ source regions 5, p⁺⁺ contact regions 6, a gate insulating film 7b, and a gate electrode 8b.

The configurational elements of the MOS gates of the first and second cells 101a, 101b are similar. Specifically, a plurality of the p-type channel regions 3 are selectively provided separated from one another in the surface layer of the n⁻ silicon carbide layer 2a, which is the side opposite to the n⁺ starting substrate 1 side (i.e., front surface layer of the semiconductor substrate 10). Each of the unit cells shares the p⁺⁺ contact region 6 with adjacent unit cells. A single unit cell is made of one MOS gate arranged between the centers (vertical dotted lines) 3a, for example, of the adjacent p-type channel regions 3.

The inside of the n⁻ silicon carbide layer 2a is selectively provided with p⁺ base regions 4 in a position deeper from the front surface of the semiconductor substrate 10 than the p-type channel regions 3. The p⁺ base regions 4 face the p-type channel regions 3 in the depth direction Z and contact the p-type channel regions 3, and cover the n⁺ starting substrate 1 side of the p-type channel regions 3. The depth direction Z is the direction going from the front surface of the semiconductor substrate 10 to the rear surface thereof. The portion of the n⁻ silicon carbide layer 2a except for the p-type channel regions 3 and p⁺ base regions 4 is the n⁻ drift region 2.

The inside of the p-type channel regions 3 is selectively provided with n⁺ source regions 5 in the surface layer on the front surface of the semiconductor substrate 10. The p⁺⁺ contact region 6 goes through the p-channel region 3 from the front surface of the semiconductor substrate 10 in the depth direction Z in the center 3a of the p-type channel region 3, for example, to reach the p-type base region 4. In other words, the p⁺⁺ contact regions 6 reach a lower position from the front surface of the semiconductor substrate 10 than the n⁺ source regions 5. The p⁺⁺ contact regions 6 contact the n⁺ source regions 5 and are disposed separated further from the gate electrodes 8a, 8b than the n⁺ source regions 5.

In the first cell 101a, a gate insulating film 7a is provided on the surface of portions of the p-type channel region 3 interposed between the n⁻ drift region 2 and the n⁺ source regions 5 so as to extend to the region(so-called JFET region) between adjacent p-type channel regions 3. In the second cell 101b, a gate insulating film 7b is provided on the surface of portions of the p-type channel region 3 interposed between the n⁻ drift region 2 and the n⁺ source regions 5 so as to extend to the JFET region.

A thickness t1b of the gate insulating film 7b of the second cell 101b is less than a thickness t1a of the gate insulating film 7a of the first cell 101a (t1b<t1a). The effects of reducing the thickness t1b of the gate insulating film 7b of the second cell 101b will be described later. Although not shown in the drawings, the portion of the gate insulating films 7a, 7b of the first and second cells 101a, 101b on the JFET region may be made thicker than the portions not on the JFET region. This makes it possible to reduce the feedback capacitance of the second cell 101b and to suppress erroneous turning ON of the second cell 101b caused by a rise in the gate potential of the first cell 101a and the second cell 101b.

A gate electrode 8a is provided on the gate insulating film 7a of the first cell 101a. The gate electrode 8a of the first cell 101a is electrically insulated by the interlayer insulating film 9 from an ohmic contact electrode 13, source electrode 14, and gate electrode 8b of the second cell 101b, which will be described later, and is electrically connected to a gate pad 103 (electrode pad: not shown in FIG. 1; see FIG. 2) at a portion not shown in the drawings. The gate threshold voltage of the first cell 101a depends on the driving conditions, but at least 3 V is desirable in order to prevent malfunctioning. The gate threshold voltage of the first cell 101a is determined by the impurity concentration of the p-channel region 3, the thickness t1a of the gate insulating film 7a, the fixed charge amount in the gate insulating film 7a, and the like, and may be around 5 V, for example.

A gate electrode 8b is provided on the gate insulating film 7b of the second cell 101b. The gate electrode 8b of the second cell 101b contacts the source electrode 14 through a contact hole 11 going through the interlayer insulating film 9 in the depth direction Z and is fixed to the potential of the source electrode 14. The gate threshold voltage of the second cell 101b is set to be greater than the potential of the source electrode 14 (for example, 0 V if the source electrode 14 is grounded). Furthermore, the gate threshold voltage of the second cell 101b is set to approximately less than or equal to the built-in voltage of the pn junction between the p-channel region 3 and p$^+$ base region 4 and the n$^-$ drift region 2 (for example, approximately less than or equal to 2.3 V when the semiconductor material is silicon carbide). By setting the gate threshold voltage of the second cell 101b to approximately less than or equal to the built-in voltage of the pn junction between the p-type channel region 3 and p$^+$ base region 4 and the n$^-$ drift region 2, it is possible to cause a reverse current of a certain magnitude to flow to the second cell 101b. The gate threshold voltage of the second cell 101b is determined by the impurity concentration of the p-type channel region 3, the thickness t1b of the gate insulating film 7b, the fixed charge amount in the gate insulating film 7b, and the like.

In the second cell 101, a width w1b of a portion directly below the gate electrode 8b and interposed between adjacent p$^+$ base regions 4 (a portion facing the gate electrode 8b in the depth direction Z across the gate insulating film 7b: JFET region) is less than a width w1a of the JFET region of the first cell 101a (w1b<w1a). By setting the width w1b of the JFET region of the second cell 101b to be less than the width w1a of the JFET region of the first cell 101a, it is possible to reduce the electric field applied to the gate insulating film 7b of the second cell 101b by the pinch-off effect, as described later.

In the inside of a contact hole 12, a contact electrode (hereinafter, ohmic contact electrode) 13 that makes ohmic contact with the n$^+$ source regions 5 and p$^{++}$ contact region 6 is provided on the n$^+$ source regions 5 and the p$^{++}$ contact region 6. The material of the ohmic contact electrode 13 may be, for example, nickel (Ni), cobalt (Co), tungsten (W), tantalum (Ta), titanium (Ti), chromium (Cr), molybdenum (Mo), zirconium (Zr), nickel silicide (NiSi), titanium silicide (TiSi), or the like. The source electrode 14 is provided on the ohmic contact electrode 13.

The source electrode 14 is provided so as to fill in the contact hole 12 and is electrically connected to all n$^+$ source regions 5 and p$^{++}$ contact regions 6 of the first and second cells 101a, 101b through the ohmic contact electrodes 13. The source electrode 14 also functions as a source pad (electrode pad). The rear surface of the n$^+$ starting substrate 1 (rear surface of the semiconductor substrate 10) is provided with an ohmic contact electrode 15 that makes ohmic contact with the n$^+$ starting substrate 1. A drain electrode 16 is provided on the ohmic contact electrode 15. The drain electrode 16 is electrically connected via the ohmic contact electrode 15 to the n$^+$ starting substrate 1, which is the n$^+$ drain region.

Figure 2:
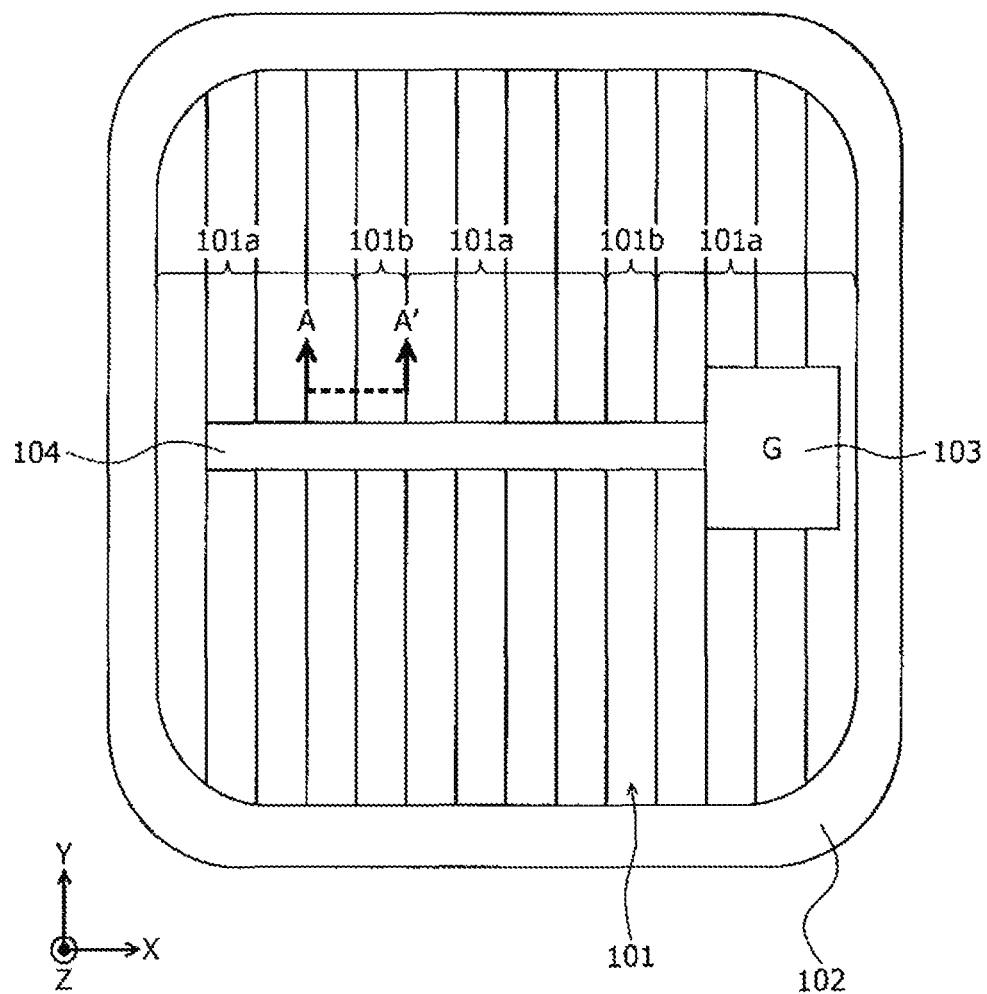
FIG. 2 is a plan view showing a layout of the semiconductor device of Embodiment 1 seen from the front surface side of a semiconductor substrate.

Next, the layout of the semiconductor device of Embodiment 1 seen from the front surface side of the semiconductor substrate 10 will be described. FIG. 2 is a plan view showing the layout of the semiconductor device of Embodiment 1 seen from the front surface side of the semiconductor substrate. FIG. 2 omits the layout of the parts inside the semiconductor substrate 10 and the interlayer insulating film 9 and source electrode 14 on the front surface of the semiconductor substrate 10. As shown in FIG. 2, the active region 101 has a substantially rectangular planar shape, for example. The edge termination region 102 has a substantially rectangular planar shape that surrounds the active region 101.

In the active region 101, the first and second cells 101a, 101b are arranged next to each other in the growth direction (hereinafter, the first direction) X of the belt-shaped stacking faults. The region in which the first cells 101a are disposed is divided into a plurality of regions by at least one of the second cells 101b. Specifically, the first and second cells 101a, 101b are arranged in stripe shapes that extend in the direction (hereinafter, second direction) Y orthogonal to the growth direction (first direction) X of the stacking faults, for example. Furthermore, the first and second cells 101a, 101b are repeatedly arranged in prescribed periods in the first direction X. For example, a group of one second cell 101b and four first cells 101a in which the second cell 101b is arranged following every four consecutive first cells 101a may be periodically and repeatedly arranged in the first direction X.

In a hypothetical situation where overcurrent flowing during abnormal operation or the like to the single-phase inverter shown in FIG. 29 cannot fully flow as reverse current of the second cell 101b, the first cell 101a operates in bipolar mode and stacking faults grow within the n$^-$ silicon carbide layer 2a, as will be described later, but by arranging the first and second cells 101a, 101b in the layout shown in FIG. 2, it is possible to stop the growth of stacking faults with the n$^-$ silicon carbide layer 2a of the second cells 101b arranged next to the first cells 101a in the first direction. This is because the bipolar current density of the second cell 101b is lower than in the first cell 101a, as described later.

Furthermore, by arranging the first and second cells 101a, 101b with the layout shown in FIG. 2, it is possible to dispersedly arrange the second cells 101b, which do not operate as MOSFET cells during normal ON operation of the first cells 101a. This makes it possible to cause a substantially uniform main current to flow to the entire active region 101 during normal ON operation of the first cells 101a. Due to this, it is possible to suppress localized voltage drops in the active region 101, and possible to prevent the first cells 101a from locally operating in a bipolar mode. The operation of the first and second cells 101a, 101b will be described later.

The gate pad 103 is disposed in the active region 101 near the boundary with the edge termination region 102, for example. A gate runner 104 is disposed in a straight line planar shape that extends in the first direction X and passes through near the center of the active region 101, for example. The gate electrodes 8a of all the first cells 101a electrically connected to the gate runner 104. The gate runner 104 is electrically insulated by the interlayer insulating films 9 (not shown in FIG. 2; see FIG. 1) from the gate electrodes 8b of all the second cells 101b. One end of the gate runner 104 is electrically connected to the gate pad 103.

Next, an example of the operation of the semiconductor device of Embodiment 1 (i.e., the operation of the first and second cells 101a, 101b) will be described in a case in which the four MOSFETs 201a to 201d (see FIG. 29) forming a single-phase inverter of a full bridge circuit configuration are made of the semiconductor device of Embodiment 1.

The first cells 101a are normal MOSFET cells. In other words, in the active region 101, the regions in which the first cells 101a are arranged are effective regions that determine the main current capability of the semiconductor device of Embodiment 1. When a voltage that is at least the gate threshold voltage relative to the source electrode 14 (potential of source electrode 14=0 V) is applied to the gate electrode 8a of the first cell 101a, an n-type inversion layer (channel) is formed in the surface regions of the p-type channel region 3 (the portions of the p-type channel region 3 along the gate insulating film 7a) of the first cell 101a.

When the surface inversion layer of the p-type channel region 3 of the first cell 101a has been formed, if a positive voltage relative to the source electrode 14 is applied to the drain electrode 16 (during forward conduction), paths of electrons are formed in the first cell 101a that go from the source electrode 14 through the ohmic contact electrodes 13, $n^+$ source regions 5, surface inversion layers of the p-type channel region 3, $n^-$ drift region 2, $n^+$ starting substrate 1, and ohmic contact electrode 15 to reach the drain electrode 16. The main current (forward current) flows through these paths (main current paths) in the first cell 101a from the drain electrode 16 toward the source electrode 14, and the first cell 101a turns ON (hereinafter, this is the normal ON state of the first cell 101a).

Meanwhile, the gate electrode 8b of the second cell 101b is fixed to the potential of the source electrode 14. Furthermore, as described above, the gate threshold voltage of the second cell 101b is set to a voltage value that is greater than the potential of the source electrode 14 (for example, 0 V, if the source electrode 14 is grounded). Due to this, during normal ON of the first cell 101a, a voltage greater than or equal to the gate threshold voltage is not applied to the gate electrode 8b of the second cell 101b. In other words, during ON of the first cell 101a, main current does not flow to the second cell 101b. Thus, in the active region 101, the regions in which the second cells 101b are disposed are ineffective regions that do not operate as a MOSFET during normal ON of the first cells 101a.

In contrast, when the surface inversion layer of the p-type channel regions 3 of the first cell 101a is formed, a negative voltage relative to the source electrode 14 is applied to the drain electrode 16 (during reverse conduction). In such case, paths of electrons are formed in the first cell 101a that go from the drain electrode 16 through the ohmic contact electrode 15, $n^+$ starting substrate 1, $n^-$ drift region 2, surface inversion layers of the p-type channel region 3, $n^+$ source regions 5, and ohmic contact electrodes 13 to reach the source electrode 14. Current (reverse current) flows through these paths in the first cell 101a from the source electrode 14 toward the drain electrode 16.

In such case, the single-phase inverter is in synchronous rectification mode, and when the gate potential of the first cell 101a is sufficiently high (for example, 15 V or greater), the first cell 101a operates as a unipolar type without the injection of minority carriers (hereinafter, unipolar mode), and thus reverse current flows to the first cell 101a. In the synchronous rectification mode, when the current Ia flowing to the inductive load 204 in the path 211 described above during conduction of the MOSFET 201a and MOSFET 201d is commutated by the MOSFETs 201a, 201d turning OFF (see FIG. 29), the MOSFETs 201c, 201b turn ON, thereby causing current (reverse current) to flow in the reverse direction to the MOSFETs 201c, 201b as compared to the direction during the normal ON.

Figure 31:
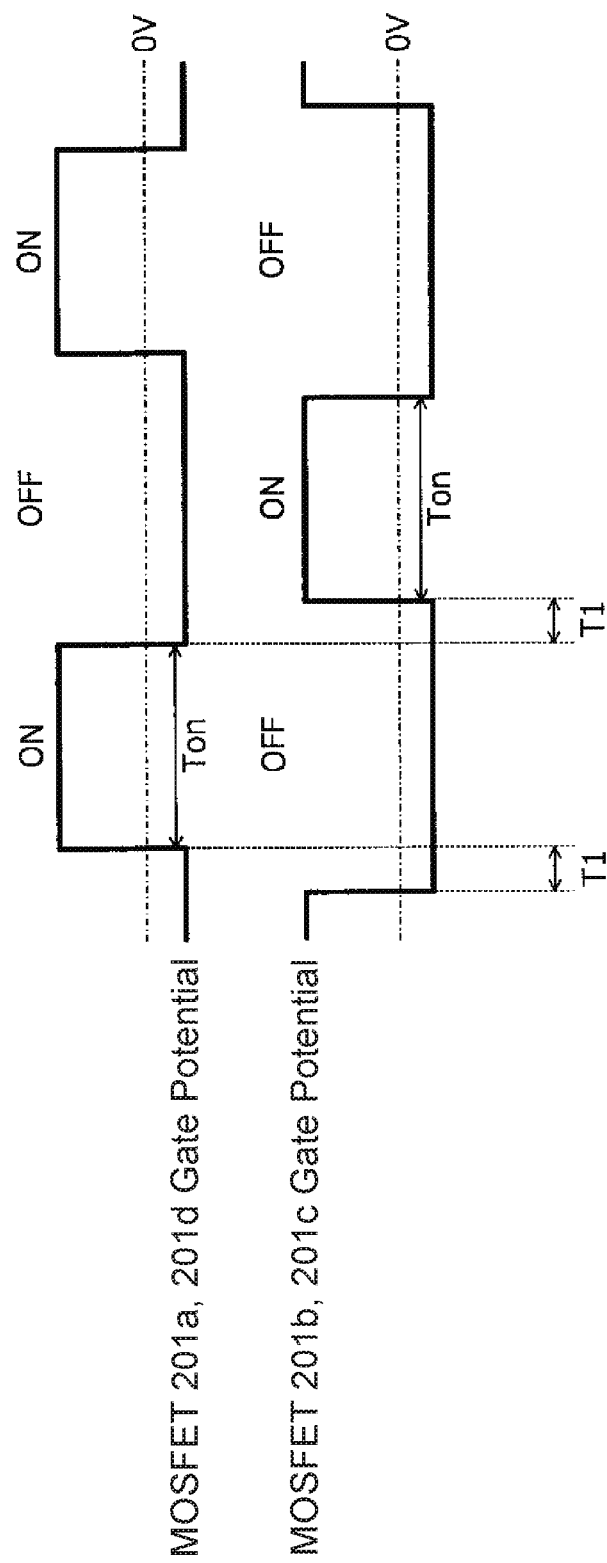
FIG. 31 is a time chart for explaining the ON/OFF operation of the MOSFETs of the single-phase inverter in FIG. 29.

During synchronous rectification mode of the single-phase inverter, there is a period (so-called deadtime) T1 in which both the MOSFETs 201a, 201c or both the MOSFETs 201b, 201d are turned OFF (see FIG. 31) so that the MOSFETs 201a, 201c or the MOSFETs 201b, 201d are not turned ON at the same time (so-called arm short circuiting). In this deadtime T1, gate voltage is not applied to the first cell 101a, and thus the surface inversion layer of the p-type channel region 3 is not formed. Accordingly, reverse current cannot flow to the first cell 101a through the surface inversion layer of the p-type channel region 3.

Therefore, in the case of the configuration in which the diodes 205a to 205d are respectively connected to the MOSFETs 201a to 201d (see FIG. 29), forward current would flow during the deadtime T1 to the parasitic pn junction diode (body diode) formed by the pn junction between the p-channel region 3 and $p^+$ base region 4 of the first cell 101a and the $n^-$ drift region 2 (hereinafter, referred to as bipolar mode).

The operation of the parasitic pn junction diode includes injection of minority carriers, and thus there is a risk that the recombination energy of the majority carriers and minority carriers could cause stacking faults to grow originating from dislocations within the silicon carbide crystals. The pn junction formed with silicon carbide as the semiconductor material has a built-in voltage of approximately 2.3 V, and thus, when the potential of the source electrode 14 is 0 V, reverse current will not flow to the first cell 101a when the potential of the drain electrode 16 is less than or equal to −2.3 V. In order to cause reverse current to flow to the first cell 101a, the drain electrode 16 of the first cell 101a is caused to function as the source, and the source electrode 14 is caused to function as the drain.

Specifically, at the time when forward current has begun to flow to the body diode of the first cell 101a, even if the difference in potential between the potential of the gate electrode 8a of the first cell 101a and the potential of the source electrode 14 were 0 V, this would be equivalent to a voltage of approximately 2.3 V (the built-in voltage of the pn junction) relative to the drain electrode 16 functioning as the source being applied to the gate electrode 8a. Due to this, as long as the gate threshold voltage of the first cell 101a is less than or equal to 2.3 V, a portion of the forward current of the body diode of the first cell 101a can be caused to flow as the reverse current of the first cell 101a in the unipolar mode via the surface inversion layer (channel) of the p-type channel regions 3.

Furthermore, when the forward current has begun to flow to the body diode of the first cell 101a, there is a drop in potential of the $n^-$ drift region 2 functioning as the source in the vicinity of the pn junction between the p-type channel regions 3 and $p^+$ base regions 4 and the $n^-$ drift region 2. Thus, even more of the forward current of the body diode of the first cell 101a can be caused to flow as the reverse current of the first cell 101a in the unipolar mode via the surface inversion layer of the p-type channel regions 3. It is reported that there is a threshold to the current density necessary for the growth of stacking faults within silicon carbide crystals, where, at or below a certain degree of current density, stacking faults do not grow, and conversely the stacking faults that have already grown contract. If the current (hereinafter, referred to as bipolar current) flowing to the first cell 101a when the first cell 101a is operating in bipolar mode can be reduced in this manner, it is possible to prevent the growth of stacking faults.

Figure 29:
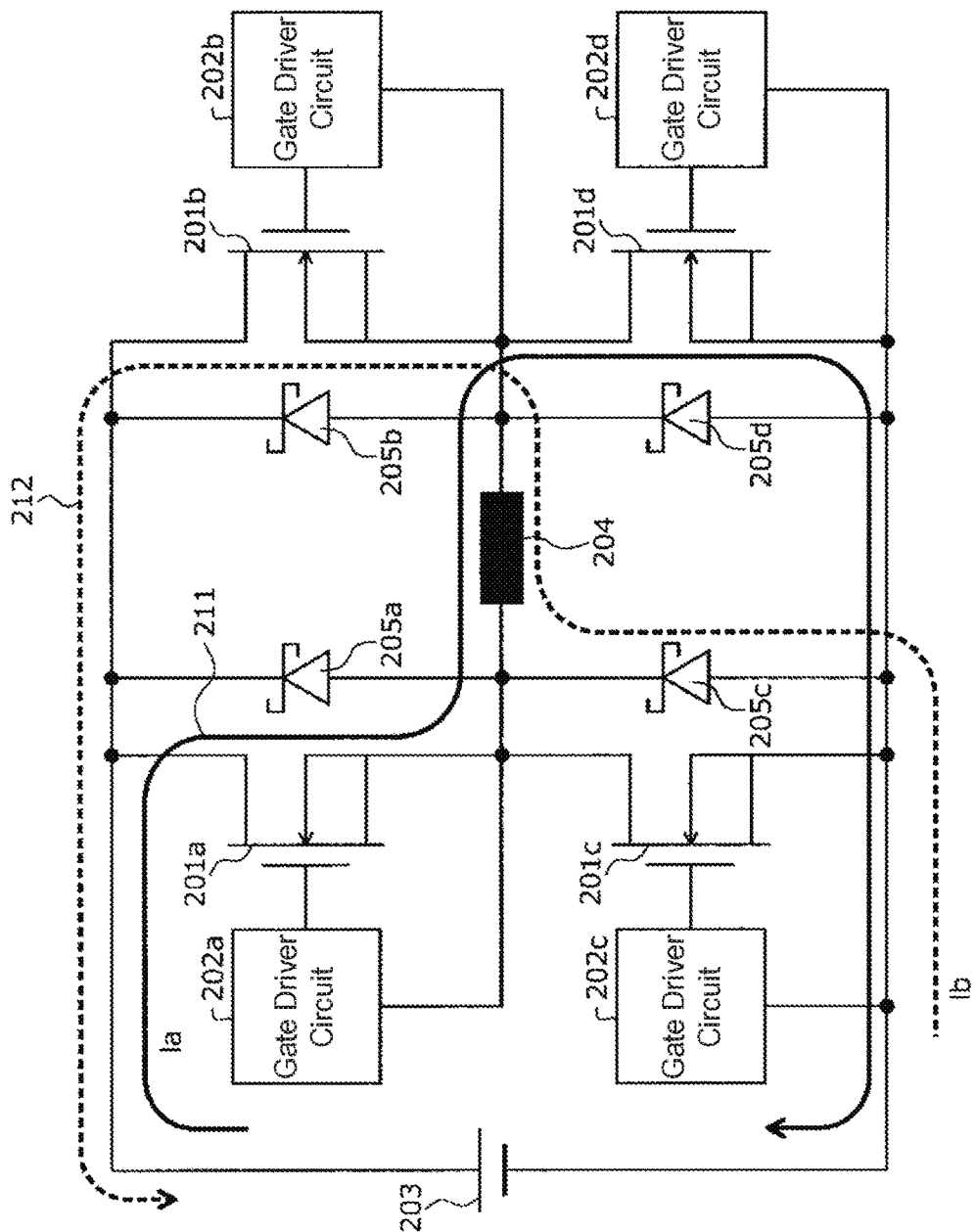
FIG. 29 is a circuit diagram showing a circuit configuration of an ordinary single-phase inverter.
Figure 30:
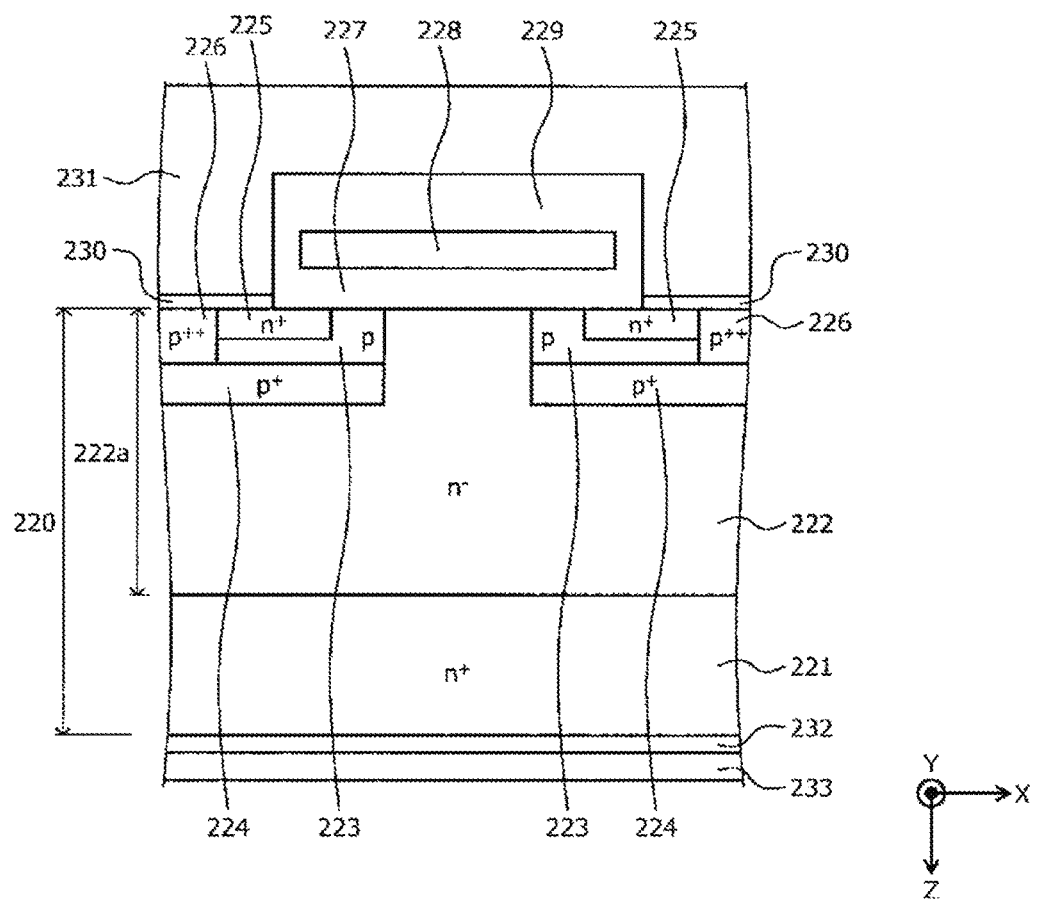
FIG. 30 is a cross-sectional view showing one example of the structure of a conventional SiC-MOSFET.

However, in the single-phase inverter of FIG. 29, for example, due to a countermeasure against dV/dt surges, there are cases in which a circuit configuration is used where reverse current cannot flow to the first cell 101a in unipolar mode. Specifically, during operation of the single-phase inverter of FIG. 29, a dV/dt surge is applied to the OFF-side MOSFET (e.g., the lower arm MOSFET 201c) when the opposing arm MOSFET (e.g., upper arm MOSFET 201a) turns ON. A dV/dt surge is a steep surge occurring in the source of an opposing arm MOSFET in conjunction with severe fluctuations in the drain voltage of the corresponding MOSFET during switching of the upper and lower arm MOSFETs.

This dV/dt surge can cause current to flow to the corresponding MOSFET through the drain-gate capacitance (feedback capacitance) of the OFF-side MOSFET, and the gate resistance or inductance of the gate wiring etc. causes the gate potential of the corresponding MOSFET to rise, causing the corresponding MOSFET to turn ON (erroneous turning ON) at an unintended timing. To prevent this erroneous turning ON, normally, a negative voltage (OFF pulse) is applied to the gate of the OFF-side MOSFET during ON of the opposing arm MOSFET (when an ON pulse has been applied to the opposing arm MOSFET) (see FIG. 31). In such case, a negative voltage is applied to the gate electrode 8a during OFF of the first cell 101a, and thus reverse current cannot flow to the first cell 101a in unipolar mode.

On the other hand, even if reverse current cannot flow to the first cell 101a in unipolar mode, it is possible for reverse current to flow to the second cell 101b in unipolar mode. This is because the potential of the gate electrode 8b of the second cell 101b is fixed to the potential of the source electrode 14. Furthermore, the gate electrode 8b of the second cell 101b is directly connected to the source electrode 14, thereby making it possible to sufficiently reduce the wiring resistance or wiring inductance etc. of the second cell 101b. Due to this, even if a negative voltage is not applied to the gate electrode 8b of the second cell 101b during OFF of the second cell 101b, it is possible to prevent erroneous turning ON of the second cell 101b.

Fixing the potential of the gate electrode 8b of the second cell 101b to the potential of the source electrode 14 is equivalent to applying a voltage of approximately 2.3 V (the built-in voltage of the pn junction) relative to the drain electrode 16 functioning as the source to the gate electrode 8b in a state in which current has begun to flow to the pn junction between the p-type channel regions 3 and $p^+$ base regions 4 and the $n^-$ drift region 2 in a reverse conduction state where the potential of the drain electrode 16 is negative relative to the potential of the source electrode 14. As described above, the gate threshold voltage of the second cell 101b is set to less than or equal to approximately 2.3 V, which is the built-in voltage of the pn junction. Due to this, a surface inversion layer is formed in the p-type channel regions 3 of the second cell 101b, and reverse current can flow through the surface inversion layer of the p-type channel regions 3 to the second cell 101b in unipolar mode.

Moreover, as described above, by making the thickness t1b of the gate insulating film 7b of the second cell 101b less than the thickness t1a of the gate insulating film 7a of the first cell 101a, it is possible to make the gate threshold voltage of the second cell 101b lower than the gate threshold voltage of the first cell 101a. This can allow current to flow to the second cell 101b during reverse conduction.

Furthermore, by making the thickness t1b of the gate insulating film 7b of the second cell 101b less than the thickness t1a of the gate insulating film 7a of the first cell 101a, it is possible to increase the reduction in the voltage applied to the drain electrode 16 functioning as the source when causing reverse current to flow to the second cell 101b (in other words, to increase the gain for a rise in gate potential relative to drain potential). This can allow even more reverse current to flow to the second cell 101b. Accordingly, it is possible to reduce the surface area of the second cell 101b (the ineffective region during normal ON of the first cell 101a) in an amount corresponding to the improvement of reverse current capability of the second cell 101b. Due to this, it is possible to improve the current capability of the first cell 101a. Surface area refers to the area (occupied area) on the front surface of the semiconductor substrate 10.

Furthermore, during normal ON of the first cell 101a, a gate voltage of approximately 15 V to 30 V is applied to the gate electrode 8a of the first cell 101a. Due to this, the gate insulating film 7a of the first cell 101a needs to be thickened to a thickness equal to or greater than approximately 50 nm to a thickness equal to or less than 100 nm in order to prevent oxide film degradation caused by Fowler-Nordheim tunneling current (current flowing through the gate insulating film 7a due to a high electric field being applied). In contrast, in the second cell 101b, the potential of the gate electrode 8b is made to be equal to the potential of the source electrode 14, and thus, even during normal ON of the first cell 101a, a high electric field is not applied to the gate insulating film 7b of the second cell 101b. Accordingly, even if the thickness t1b of the gate insulating film 7b of the second cell 101b is thin, oxide film degradation of the gate insulating film 7b does not occur.

Furthermore, during OFF of the second cell 101b, there is a risk that a high electric field could be applied to the gate insulating film 7b if a high voltage is applied to the drain electrode 16. Due to this, as described above, it is preferable for the width w1b of the JFET region of the second cell 101b to be made less than the width w1a of the JFET region of the first cell 101a, in order to reduce the electric field applied to the gate insulating film 7b of the second cell 101b due to the pinch-off effect. In the first cell 101a, if the width w1a of the JFET region is narrowed, JFET resistance will increase and ON resistance will increase, but during normal ON of the first cell 101a, the main current will not flow to the second cell 101b, as described above. Due to this, even if the width w1b of the JFET region of the second cell 101b is narrowed, there are no adverse effects on the characteristics of the second cell 101b.

Furthermore, when causing reverse current to flow to the second cell 101b, the pn junction between the p-type channel regions 3 and $p^+$ base regions 4 and the $n^-$ drift region 2 is forward biased, and thus the depletion layer spreading from the pn junction contracts. Thus, even if the width w1b of the JFET region of the second cell 101b is narrowed, it is possible to suppress an increase in resistance for the reverse current caused by the JFET effect of the second cell 101b. Instead of narrowing the width w1b of the JFET region of the second cell 101b more than the width w1a of the JFET region of the first cell 101a, similar effects can be obtained by setting the impurity concentration of the JFET region of the second cell 101b to be higher than the impurity concentration of the JFET region of the first cell 101a.

Furthermore, the gate threshold voltage of the first cell 101a may be set to be higher than the gate threshold voltage of the second cell 101b by forming the gate electrodes 8a, 8b of differing materials and the difference in Fermi levels of the materials. For example, the gate electrode 8a of the first cell 101a could be formed of p-type polysilicon (poly- Si) and the gate electrode 8b of the second cell 101b could be formed of n-type polysilicon. In other words, in the case of an n-channel type SiC-MOSFET, the gate electrode 8b of the second cell 101b would be formed of a material with a higher Fermi level than the gate electrode 8a of the first cell 101a. Due to this, the gate threshold voltage of the second cell 101b can be reduced by approximately 1 V than the gate threshold voltage of the first cell 101a, which allows even more reverse current to flow to the second cell 101b.

Furthermore, instead of making the thickness t1b of the gate insulating film 7b of the second cell 101b less than the thickness t1a of the gate insulating film 7a of the first cell 101a, similar effects can be obtained in a case in which at least a portion of the gate insulating film 7b of the second cell 101b is made of an insulating film with a higher dielectric constant than the gate insulating film 7a of the first cell 101a. Specifically, the gate insulating film 7b of the second cell 101b may be a laminate structure of an insulating film formed of a material with a high dielectric constant or silicon oxide ($SiO_2$) and an insulating film formed of a material with a high dielectric constant, for example. A material with a high dielectric constant is aluminum nitride (AlN), aluminum oxide ($Al_2O_3$), and a silicon nitride film ($Si_3N_4$), for example.

At least one of conditions described above for increasing the reverse current amount flowing to the second cell 101b (the thicknesses t1a, t1b of the gate insulating films 7a, 7b, the dielectric constant of the gate insulating films 7a, 7b, the material of the gate electrodes 8a, 8b) need be satisfied, and it is not necessary for all to be set at the same time. For example, the conditions described above for increasing the reverse current amount flowing to the second cell 101b may be appropriately set by an optimum combination of the impurity concentration and thickness of the p-type channel region 3, the thicknesses t1a, t1b of the gate insulating films 7a, 7b, and the like.

As described above, in Embodiment 1, the thickness of the gate insulating film of the second cell in which the gate electrode is connected to a potential (potential of the source electrode) other than the gate potential of the first cell is made less than the thickness of the gate insulating film of the first cell functioning as a normal MOSFET cell, or the dielectric constant of the gate insulating film of the second cell is made greater than the dielectric constant of the first cell. This makes it possible to increase the current amount of the reverse current flowing to the second cell during reverse conduction. It is possible to reduce the occupied area (surface area) of the second cell acting as the ineffective region in the active region during normal ON of the first cell in an amount corresponding to the improvement of reverse current capability of the second cell. This makes it possible to suppress a reduction in area of the effective region of the active region. A high gate voltage is not applied to the second cell, and thus it is possible to ensure the reliability of the gate insulating film, even if the thickness of the gate insulating film of the second cell is reduced.

Furthermore, in Embodiment 1, the forward current of the body diode of the first cell can be caused to flow as reverse current of the second cell, and thus it is possible to suppress the growth of stacking faults occurring due to operation of the first cell in bipolar mode, and possible to suppress an increase in ON resistance of the first cell. In addition, in Embodiment 1, the thickness of the gate insulating film of the first cell can be increased, and thus the feedback capacitance of the first cell can be reduced, and it is possible to suppress erroneous turning ON of the first cell caused by increases in gate potential of the first cell. In Embodiment 1, the first and second cells are arranged in parallel in the growth direction (the first direction) of the stacking faults, and the region in which the first cells are arranged is divided by the regions in which the second cell having the lower bipolar current density than the first cell is disposed. Due to this, even if stacking faults have grown by operation of the first cells in bipolar mode due to overcurrent or the like, it is possible to suppress growth of the stacking faults in the regions in which the second cell is disposed.

Furthermore, in Embodiment 1, the gate threshold voltage of the first cell is set relatively high by forming the gate electrode of the first cell with p-type polysilicon, and the gate threshold voltage of the second cell is set relatively low by forming the gate electrode of the second cell with n-type polysilicon. By setting the gate threshold voltage of the first cell high, it is possible to suppress erroneous turning ON of the first cell. By setting the gate threshold voltage of the second cell low, it is possible to further increase the current amount of reverse current flowing to the second cell during reverse conduction. In addition, in Embodiment 1, in a case in which four MOSFETs (see FIG. 29) form a single-phase inverter of a full bridge circuit configuration, for example, it is not necessary to provide external diodes in parallel to the respective MOSFETs. Thus, it is possible to decrease costs.

In Patent Document 4 above, an SiC-MOSFET is set to a normally-OFF state, and in order to cause a lot of reverse current to flow to the MOSFET, it is necessary to make the n-type channel region directly below the gate electrode thin or to have a high impurity concentration. This n-type channel region is formed by normal epitaxial growth, but it is not easy to control thickness or impurity concentration. Due to this, in Patent Document 4 above, there is large variation in the gate threshold voltage, and yield is reduced. In contrast, in Embodiment 1, an n-type channel region is not provided as in Patent Document 4 above, but rather a large amount of reverse current can be caused to flow through the surface region of the p-type channel region of the second cell. Moreover, the first and second cells can be manufactured with relatively easy-to-control manufacturing parameters, such as the thicknesses of the gate insulating films, the impurity concentrations of the p-type channel regions, or the like, and thus it is possible to suppress variations in the gate threshold voltage and to suppress reductions in yield.

Embodiment 2

Figure 3:
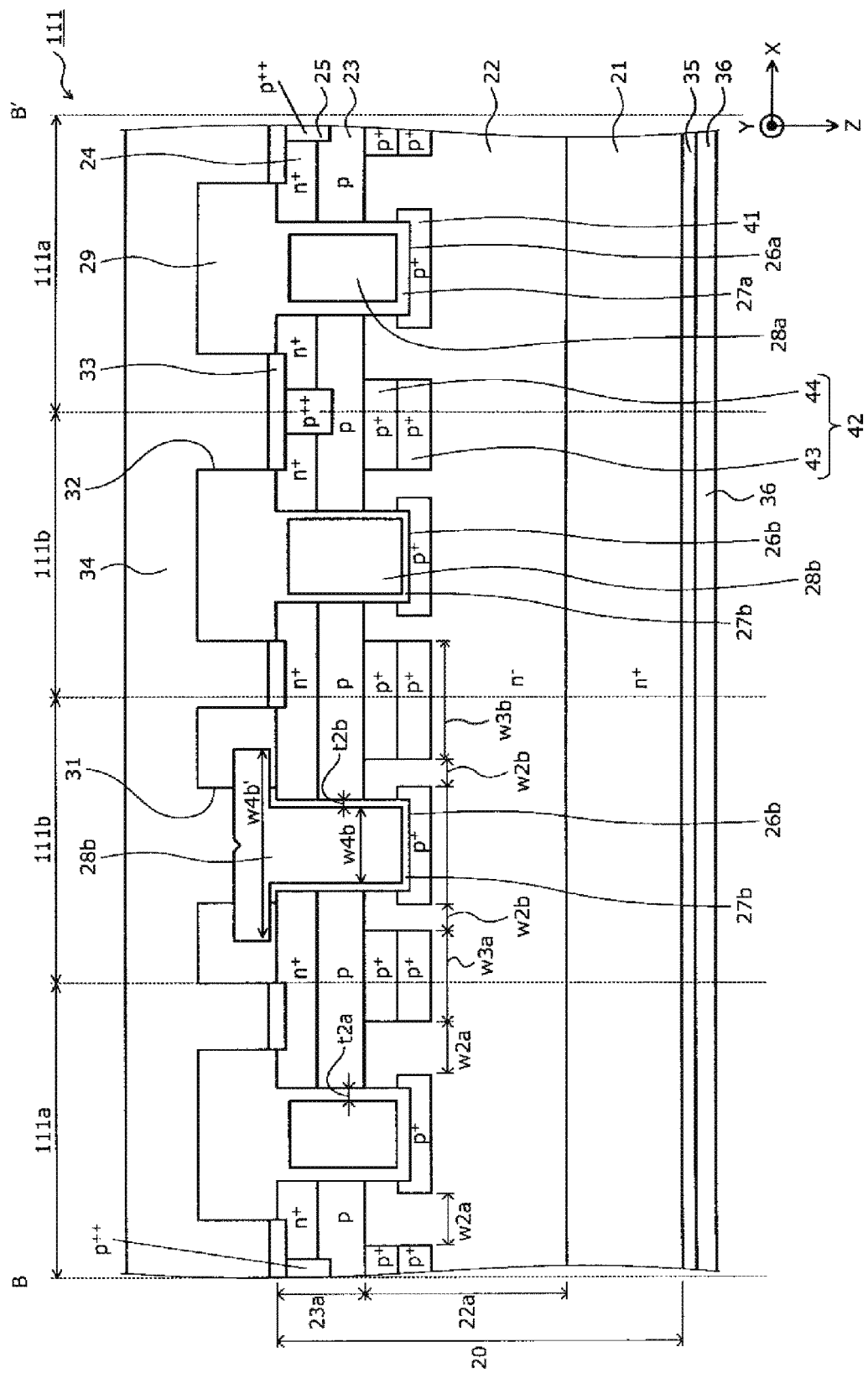
FIG. 3 is a cross-sectional view showing main parts of a semiconductor device of Embodiment 2.

Next, the structure of a semiconductor device of Embodiment 2 will be described. FIG. 3 is a cross-sectional view showing main parts of the semiconductor device of Embodiment 2. FIG. 3 shows the cross-sectional structure of the cutting line B-B' in FIG. 4, which will be described later. Specifically, FIG. 3 shows two first cells 111a, and two second cells 111b interposed between the two first cells 111a. The semiconductor device of Embodiment 2 is a configuration in which the semiconductor device of Embodiment 1 has been applied to a trench gate MOSFET. The semiconductor device of Embodiment 2 shown in FIG. 3 is an SiC-MOSFET device having a drain structure and gate structures in which first and second cells (MOSFET unit cells) 111a, 111b are arranged in a prescribed layout in an active region 111 of a semiconductor substrate (semiconductor chip) 20 made of silicon carbide.

The semiconductor substrate 20 is formed by epitaxially growing, in order, silicon carbide layers 22a, 23a that respectively serve as $n^-$ drift regions 22 and p-type channel regions 23 on the front surface of an $n^+$ starting substrate 21 made of silicon carbide. Similar to Embodiment 1, the first and second cells 111a, 111b have MOS gates fixed to differing potentials, and at least one of each cell is provided. The MOS gate of the first cell 111a is made of p-type channel regions 23, n⁺ source regions 24, p⁺⁺ contact regions 25, a first trench 26a, a gate insulating film 27a, and a gate electrode 28a. The MOS gate of the second cell 111b is made of p-type channel regions 23, n⁺ source regions 24, a second trench 26b, a gate insulating film 27b, and a gate electrode 28b.

The configurational elements of the MOS gates of the first and second cells 111a, 111b are similar. If the p⁺⁺ contact region 25 is provided between the adjacent first cell 111a and the second cell 111b, the second cell 111b may share the p⁺⁺ contact region 25 with the adjacent first cell 111a. Specifically, the n⁻ silicon carbide layer 22a, which serves as the n⁻ drift region 22, is provided on the front surface of the n⁺ starting substrate 21. The p-type silicon carbide layer 23a, which serves as the p-type channel region 23, is provided on the surface of the n⁻ silicon carbide layer 22a, which is the side opposite to the n⁺ starting substrate 21. The inside of the p-type silicon carbide layer 23a is selectively provided with n⁺ source regions 24.

Within the p-type silicon carbide layer 23a, in a mesa region between the first trenches 26a of the first cells 111a at a location closer to the center of the mesa region than the n⁺ source region 24, p⁺⁺ contact regions 25 are selectively disposed contacting the n⁺ source region 24. The p⁺⁺ contact region 25 may be selectively provided inside the p-type silicon carbide layer 23a between the second trenches 26b of the second cells 111b or between the first trench 26a and second trench 26b (mesa region). The portion of the p-type silicon carbide layer 23a except for the n⁺ source regions 24 and p⁺⁺ contact regions 25 is the p-type channel region 23.

The first and second trenches 26a, 26b go through the n⁺ source regions 24 and p-type channel regions 23 to reach the n⁻ drift region 22. For example, one unit cell (first cell 111a or second cell 111b) is formed between the approximate centers of adjacent mesa regions sandwiching a MOS gate embedded in one trench (first trench 26a or second trench 26b). The first and second trenches 26a, 26b may both have the same dimensions (width, depth). The first and second trenches 26a, 26b may be arranged at the same pitch, for example. In other words, the width of all mesa regions may be equal.

The inside of the first trench 26a of the first cell 111a is provided with a gate electrode 28a via a gate insulating film 27a. The gate electrode 28a is formed of p-type polysilicon, for example. The gate electrode 28a is electrically insulated by an interlayer insulating film 29 from an ohmic contact electrode 33, source electrode 34, and a gate electrode 28b of the second cell 111b, which will be described later, and is electrically connected to a gate pad 113 (gate pad: not shown in FIG. 3; see FIG. 4) by a portion not shown in the drawings via a gate runner 114. In other words, similar to Embodiment 1, the first cell 111a is a normal MOSFET cell.

The inside of the second trench 26b of the second cell 111b is provided with a gate electrode 28b via a gate insulating film 27b. A thickness t2b of the gate insulating film 27b is less than a thickness t2a of the gate insulating film 27a (t2b<t2a). The effects obtained by setting the thickness t2b of the gate insulating film 27b to be less than the thickness t2a of the gate insulating film 27a are similar to Embodiment 1. The gate electrode 28b may be formed of n-type polysilicon, for example. The effects obtained by forming the gate electrode 28a with p-type polysilicon and the gate electrode 28b with n-type polysilicon are similar to Embodiment 1.

The gate electrode 28b contacts the source electrode 34 through a contact hole 31 that goes through the interlayer insulating film 29 in the depth direction Z and is fixed to the potential of the source electrode 34. In other words, similar to Embodiment 1, the second cell 111b is an ineffective region during normal ON of the first cell 111a. In addition, when a negative voltage relative to the source electrode 34 is applied to the drain electrode 36, similar to Embodiment 1, reverse current can be caused to flow to the second cell 111b in unipolar mode, even if reverse current cannot be caused to flow to the first cell 111a in unipolar mode (when a negative voltage is applied to the gate electrode 28a). A plurality of the contact holes 31 may be provided in order to partially expose a single gate electrode 28b, as will be described later.

The gate electrode 28b, by being embedded inside the second trench 26b, has a width w4b (≈width of second trench 26b) that is narrower than the width of the gate electrode of the planar gate structure of Embodiment 1 (See FIG. 1). Due to this, in cases such as where it is difficult to directly connect the source electrode 34 via the contact hole 31 to the gate electrode 28b embedded inside the second trench 26b, the gate electrode 28b can be made to protrude upward from the inside of the second trench 26b and extended onto the front surface of the semiconductor substrate 20. This makes it possible to widen a width w4b' of the gate electrode 28b by the portion protruding upward from the inside of the second trench 26b, and makes it easy to directly connect the source electrode 34 via the contact hole 31 to the gate electrode 28b.

Furthermore, the inside of the n⁻ drift region 22 (n⁻ silicon carbide layer 22a) is selectively provided with first and second p⁺ regions 41, 42. Each of the first p⁺ regions 41 is provided directly below the bottom surface (drain side) of each first and second trenches 26a, 26b and covers the bottom surface (or the bottom surface and bottom surface corner portion) of each first and second trenches 26a, 26b. The bottom surface corner portion of the first and second trenches 26a, 26b is the boundary between the bottom surface and the sidewalls of the first and second trenches 26a, 26b. The first p⁺ regions 41 are provided separated from the p-type channel regions 23 at a position deeper toward the drain side than the interfaces between the p-type channel region 23 and the n⁻ drift region 22.

Each of the first p⁺ regions 41 may be a floating potential, or a portion thereof may contact the second p⁺ region 42. A reduction in feedback capacitance and the like are obtained by the first p⁺ region 41 electrically connecting to the p-type channel region 23 via the second p⁺ region 42. The second p⁺ region 42 is provided in each mesa region. In the example shown in FIG. 3, the second p⁺ regions 42 are provided apart from the first p⁺ regions 41. Furthermore, the second p⁺ regions 42 contact the p-type channel regions 23. The second p⁺ region 42 may be a two-layer structure of p⁺ regions 43, 44 facing in the depth direction Z and contacting each other.

By providing the first and second p⁺ regions 41, 42, it is possible to form the pn junction between the first p⁺ regions 41 and n⁻ drift region 22 near the bottom surface of the first and second trenches 26a, 26b. Furthermore, the pn junction between the second p⁺ regions 42 and n⁻ drift region 22 can be formed between the adjacent first trenches 26a, between adjacent first and second trenches 26a, 26b, and between adjacent second trenches 26b at positions deeper toward the drain side than the bottom surfaces of the first and second trenches 26a, 26b. This can prevent a high electric field from being applied to the portions of the gate insulating films 27a, 27b at the side surfaces of the first and second trenches 26a, 26b.

The width w2b of the portion (so-called JFET region) of the second cell 111b between the first p$^+$ region 41 and second p$^+$ region 42 is narrower than the width w2a of the JFET region of the first cell 111a. Similar to Embodiment 1, this makes it possible to reduce the electric field applied to the gate insulating film 27b of the second cell 111b during OFF of the second cell 111b. The width w3a of the second p$^+$ regions 42 disposed between the adjacent first trenches 26a and between the adjacent first and second trenches 26a, 26b may be narrower than the width w3b of the second p+ region 42 disposed between the second trenches 26b.

In the inside of the contact hole 32, an ohmic contact electrode 33 is provided on the n$^+$ source region 24 and p$^{++}$ contact region 25 (only on the n$^+$ source region 24 in a mesa region where the p$^{++}$ contact region 25 is not provided). The configuration of the ohmic contact electrode 33 is similar to Embodiment 1. The source electrode 34 is provided so as to fill in the contact hole 32 and is electrically connected to all n$^+$ source regions 24 and p$^{++}$ contact regions 25 of the first and second cells 111a, 111b through the ohmic contact electrodes 33. The source electrode 34 also functions as a source pad (electrode pad).

The rear surface of the n$^+$ starting substrate 21 (rear surface of the semiconductor substrate 20) is provided with an ohmic contact electrode 35 that makes ohmic contact with the n$^+$ starting substrate 21. The drain electrode 36 is provided on the ohmic contact electrode 35. The drain electrode 36 is electrically connected via the ohmic contact electrode 35 to the n$^+$ starting substrate 21, which is the n$^+$ drain region.

Figure 4:
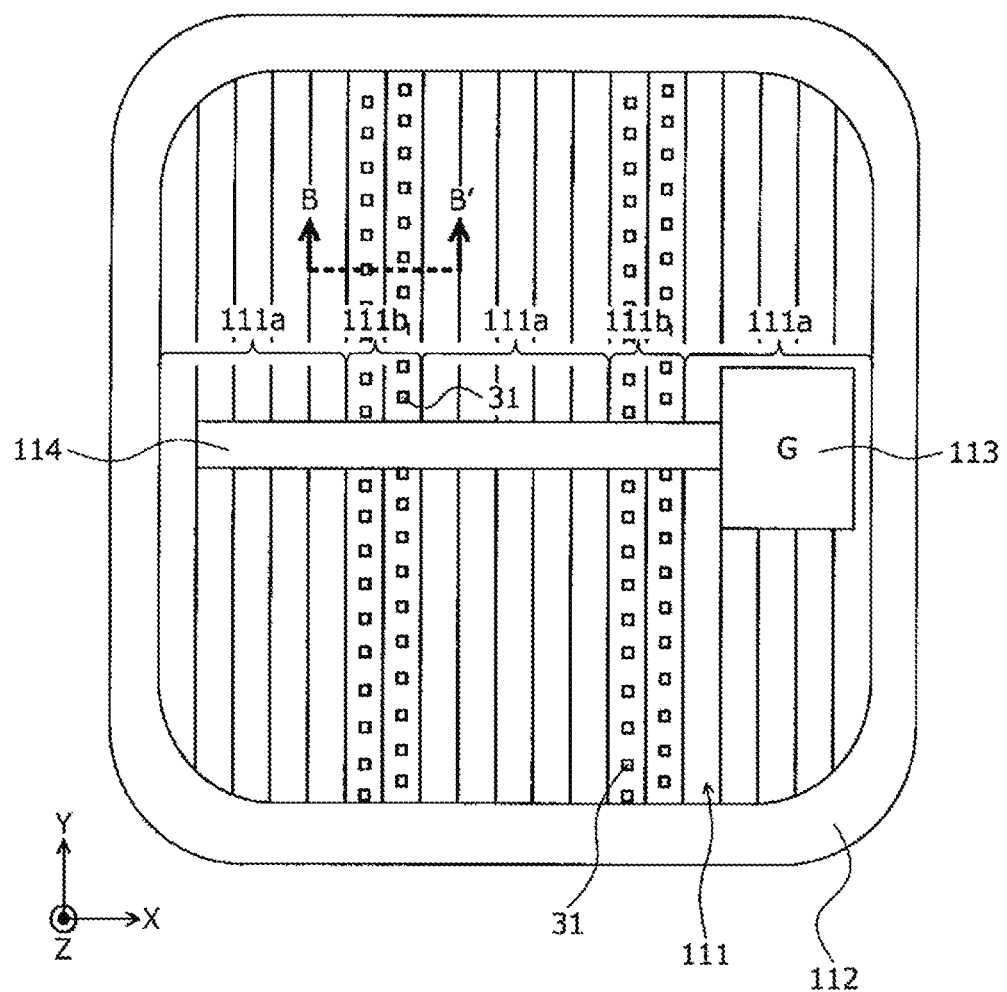
FIG. 4 is a plan view showing a layout of the semiconductor device of Embodiment 2 seen from the front surface side of a semiconductor substrate.

Next, the layout of the semiconductor device of Embodiment 2 seen from the front surface side of the semiconductor substrate 20 will be described. FIG. 4 is a plan view showing the layout of the semiconductor device of Embodiment 2 seen from the front surface side of the semiconductor substrate. FIG. 4 omits the layout of the parts inside the semiconductor substrate 20 and the interlayer insulating film 29 and source electrode 34 on the front surface of the semiconductor substrate 20. As shown in FIG. 4, the active region 111 has a substantially rectangular planar shape, for example. The edge termination region 112 has a substantially rectangular planar shape that surrounds the active region 111.

In the active region 111, the first and second cells 111a, 111b are repeatedly arranged in prescribed periods in the growth direction (the first direction) of the stacking faults. For example, a group of one second cell 111b and four first cells 111a in which the second cell 111b is arranged following every four consecutive first cells 111a may be periodically and repeatedly arranged in the first direction X. The first and second cells 111a, 111b are arranged in stripe shapes extending in the second direction Y, for example. The first and second trenches 26a, 26b (see FIG. 3) are arranged in stripe shapes extending in the second direction Y. In the drawing, two of the second cells 111b are arranged continuously, but the second cells 111b may be arranged uniformly, with a configuration in which one second cell 111b is arranged periodically for each first cell 111a.

A plurality of the contact holes 31 exposing the gate electrode 28b (see FIG. 3) of the second cell 111b are provided with prescribed gaps therebetween in the second direction Y. In the plurality (here, two) of adjacent second cells 111b, the contact holes 31 may be arranged such that the contact holes 31 of each of the second cells 111b do not face each other in the first direction X. The configuration and layout of the gate pad 113 and gate runner 114 are similar to those of Embodiment 1 (see FIG. 2).

Furthermore, by arranging the second cells 111b as shown in FIG. 4, the second cells 111b can stop the growth of belt shape stacking faults, even if the stacking faults have grown in the n$^-$ drift regions 22 (n$^-$ silicon carbide layer 22a) of the first cells 111a. Due to this, it is possible to suppress an increase in ON resistance of the first cells 111a. The configurations described above for increasing the reverse current amount flowing to the second cell 111b do not need to be set at the same time, and similar to Embodiment 1, may be appropriately set in an optimum combination of the impurity concentration and thickness of the p-type channel region 23, the thicknesses t1a, t1b of the gate insulating films 27a, 27b, and the like.

As described above, Embodiment 2 makes it possible to obtain similar effects to Embodiment 1 when applied to a trench gate MOSFET.

Embodiment 3

Figure 5:
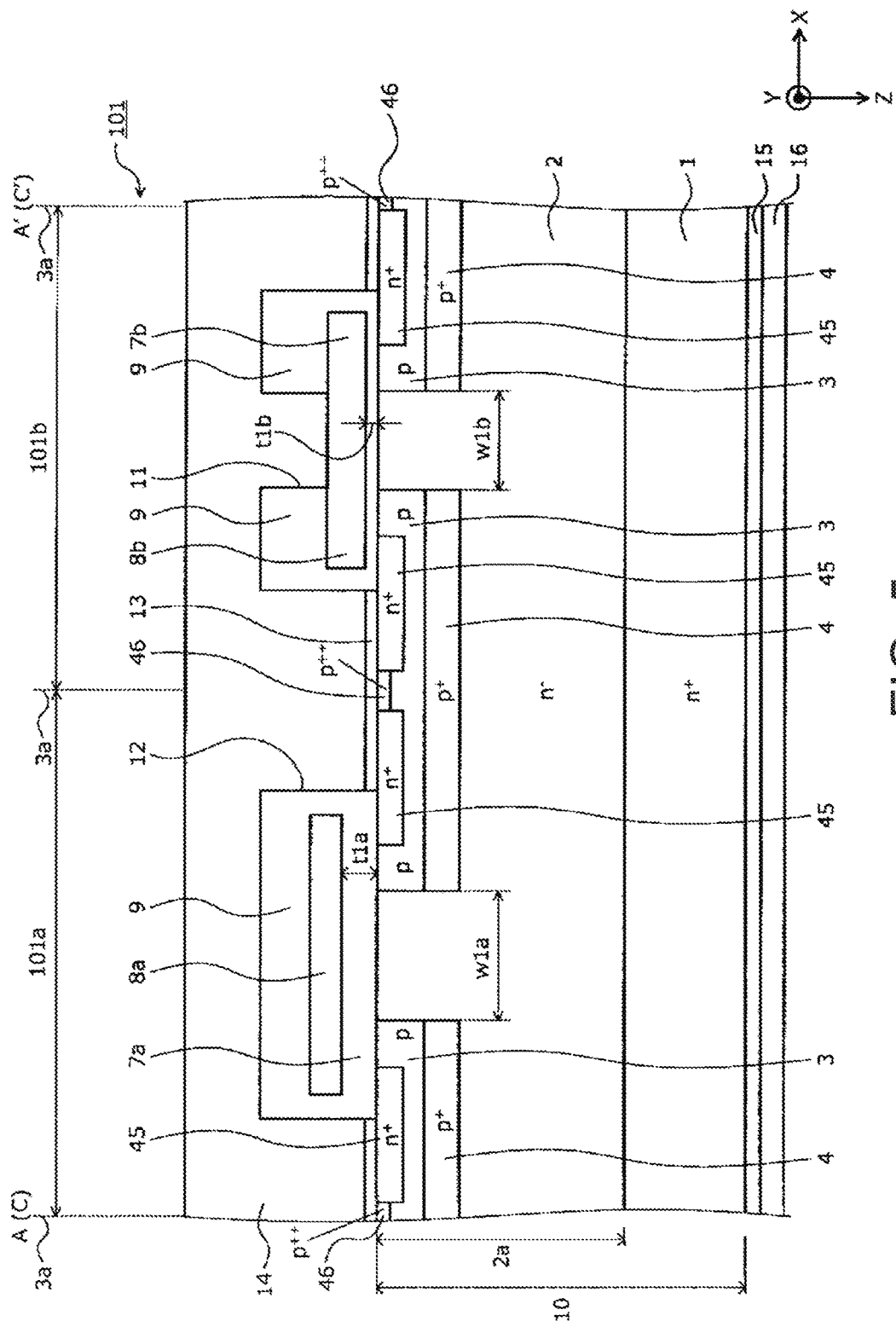
FIG. 5 is a cross-sectional view showing main parts of a semiconductor device of Embodiment 3.
Figure 6:
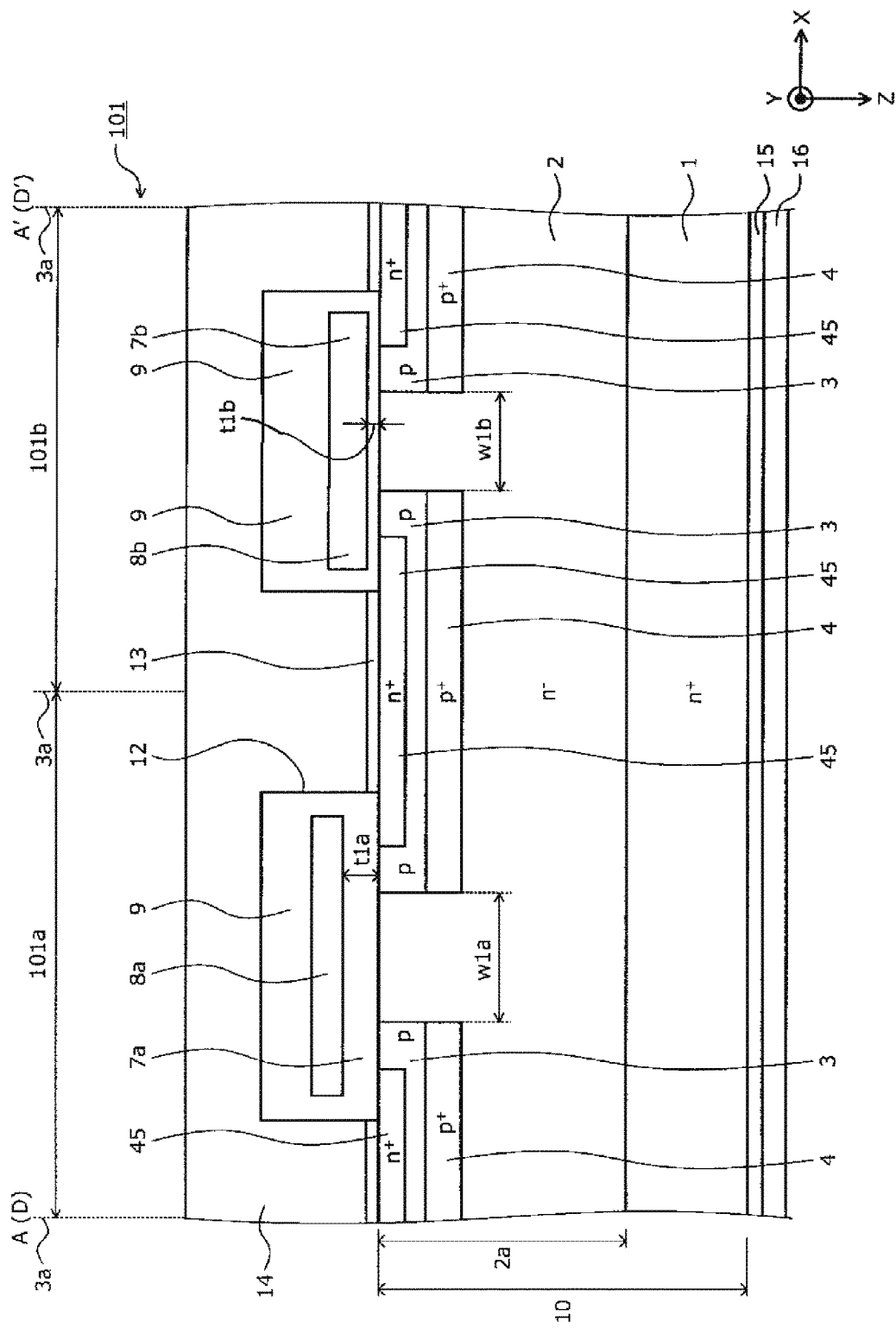
FIG. 6 is a cross-sectional view showing main parts of the semiconductor device of Embodiment 3.
Figure 7:
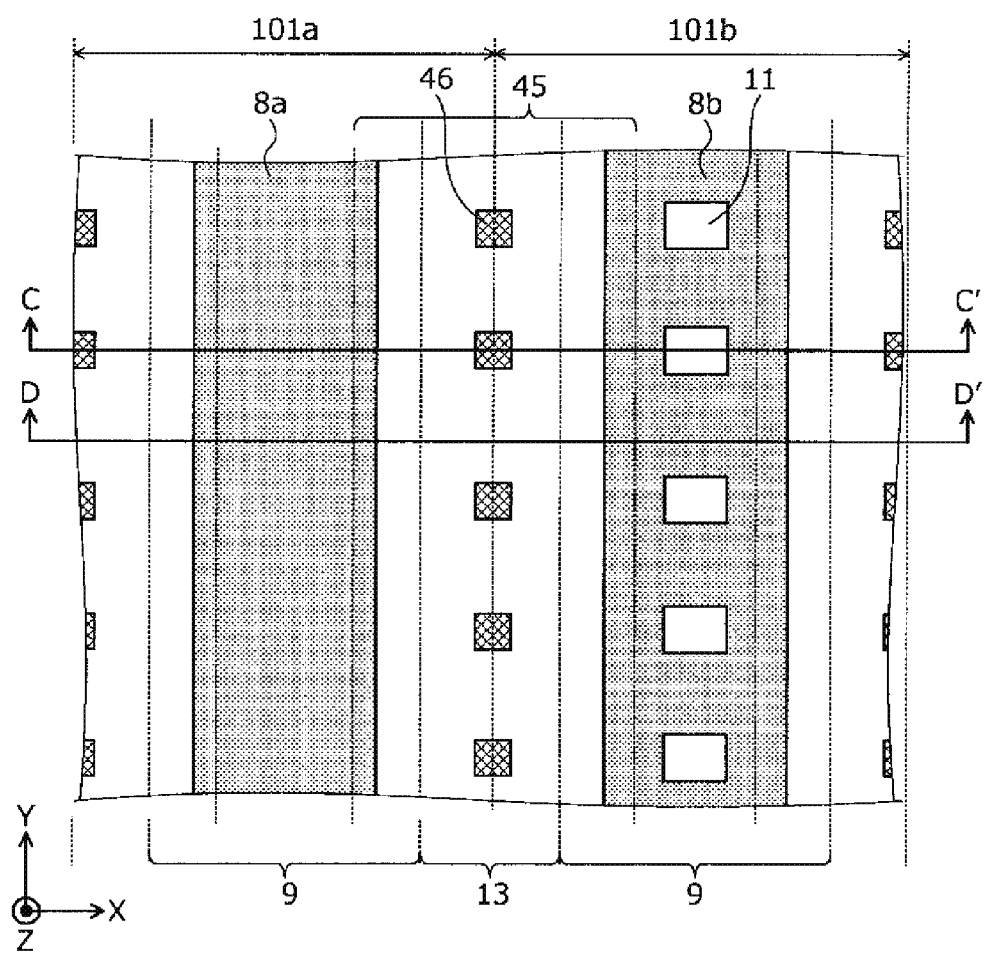
FIG. 7 is a plan view showing a layout of the semiconductor device of Embodiment 3 seen from the front surface side of a semiconductor substrate.

Next, the structure of a semiconductor device of Embodiment 3 will be described. FIGS. 5 and 6 are cross-sectional views showing the structure of the semiconductor device of Embodiment 3. FIGS. 5 and 6 show cross-sectional structures of FIG. 2 along the cutting line A-A'. FIG. 5 shows a cross-sectional structure of FIG. 7 along the cutting line C-C'. FIG. 6 shows a cross-sectional structure of FIG. 7 along the cutting line D-D'. FIG. 7 is a plan view showing the layout of the semiconductor device of Embodiment 3 seen from the front surface side of the semiconductor substrate. FIG. 7 enlarges the area near the cutting line A-A' of FIG. 2. The hatching portions of FIG. 7 are gate electrodes 8a, 8b.

The semiconductor device of Embodiment 3 differs from the semiconductor of Embodiment 1 in that, in the first cell 101a and second cell 101b, the surface area of a p$^{++}$ contact region 46 is reduced, or the depth of the p$^{++}$ contact region 46 is made less than the depth of an n$^+$ source region 45, or both (FIG. 5). The surface area of the p$^{++}$ contact region 46 refers to the contact area between the p$^{++}$ contact region 46 and ohmic contact electrode 13. The p$^{++}$ contact region 46 of the second cell 101b refers to the p$^{++}$ contact regions disposed between adjacent second cells 101b and the p$^{++}$ contact regions disposed between adjacent first and second cells 101a, 101b.

In other words, in Embodiment 3, as compared to Embodiment 1, the surface area of the p$^{++}$ contact region 46 of the second cell 101b is made smaller, or the depth of the p$^{++}$ contact region 46 of the second cell 101b is made shallower, thereby increasing contact resistance between a silicon carbide part (semiconductor substrate 10) and the ohmic contact electrodes 13. For example, as shown in FIG. 7, the surface area of the p$^{++}$ contact region 46 may be smaller than the opening area of the contact hole 11, for example. The p$^{++}$ contact region 46 may be arranged in a plurality with prescribed gaps therebetween in the first direction X, for example. In such case, the n$^+$ source region 45 surrounds all of the p$^{++}$ contact regions 46 provided inside the same p-type channel region 3, for example.

By increasing the contact resistance between the silicon carbide part and the ohmic contact electrode 13 in the second cell 101b in this manner, when a negative voltage relative to the source electrode 14 is applied to the drain electrode 16, the flowing of current to the body diode of the second cell 101b causes a drop in potential of the p$^+$ base region 4 of the second cell 101b due to the voltage drop of the body diode. In conjunction with the drop in potential of the p$^+$ base region 4 of the second cell 101b, the potential of the n$^-$ drift region 2 in the vicinity of the p$^+$ base region 4 drops. Due to this, the difference in potential between the n$^-$ drift region 2 functioning as the source when reverse current is caused to flow to the second cell 101b and the gate electrode 8b fixed to the potential of the source electrode 14 becomes larger. This makes it possible to increase the reverse current amount flowing to the second cell 101b through the surface inversion layer of the p-type channel region 3. Thus, it is possible to set the density of current flowing to the body diode of the second cell 101b to be less than the current density at which stacking faults grow. There is also less susceptibility of bipolar current, with respect to the first cell 101a.

Furthermore, in order to set the density of the current flowing to the body diode of the second cell 101b to less than the current density at which stacking faults grow, it is desirable to set the surface area of the p$^{++}$ contact regions 46 (the contact area between the p$^{++}$ contact regions 46 and ohmic contact electrode 13) to be less than $\frac{1}{10}$ of the contact area between the n$^+$ source regions 45 and ohmic contact electrode 13. If the surface area of the p$^{++}$ contact region 46 is reduced, there is a risk that hole current could flow to the second cell 101b due to current generated during avalanche breakdown, and that the second cell 101b would operate in bipolar mode with this hole current as base current and the avalanche resistance of the second cell 101b would be reduced, but this is permissible to a certain degree as compared to if the semiconductor material were silicon. The reason for this is the following. The built-in voltage of a pn junction made with silicon as the semiconductor material is approximately 0.6 V, whereas the built-in voltage of a pn junction made with silicon carbide as the semiconductor material is approximately 2.3 V. Thus, as compared to a case in which silicon is the semiconductor material, it is possible to have a certain degree of margin in the period until the second cell 101b starts operating in bipolar mode during avalanche breakdown.

If a p$^{++}$ contact region with a relatively large surface area exists in the active region 101, it is easy for the current of the body diode of the first and second cells 101a, 101b to be concentrated in this p$^{++}$ contact region. Due to this, it is preferable not only to reduce the surface area of the p$^{++}$ contact region 46 of the second cell 101b, but to reduce the surface area of the p$^{++}$ contact regions 46 for both the first and second cells 101a, 101b. Furthermore, in Embodiment 3, the gate electrodes 8a, 8b of the first and second cells 101a, 101b may both be made of p-type polysilicon, or the gate electrodes 8a, 8b of the first and second cells 101a, 101b may both be made of n-type polysilicon.

As described above, Embodiment 3 can obtain effects similar to those of Embodiments 1 and 2. Furthermore, in Embodiment 3, the contact resistance with the ohmic contact electrode is increased by reducing the surface area of the p$^{++}$ contact region, or reducing the depth of the p$^{++}$ contact region, or both of them. This makes it harder for current to flow to the parasitic diodes (body diodes) formed at the pn junctions between the p-type channel regions and n$^-$ drift regions during reverse conduction, and the potential of the drain electrode drops relative to the potential of the source electrode. Due to this, the potential of the gate electrode relative to the drain electrode functioning as the source is increased during reverse conduction, thus making it possible to further increase the reverse current amount flowing to the second cells.

Embodiment 4

Figure 8:
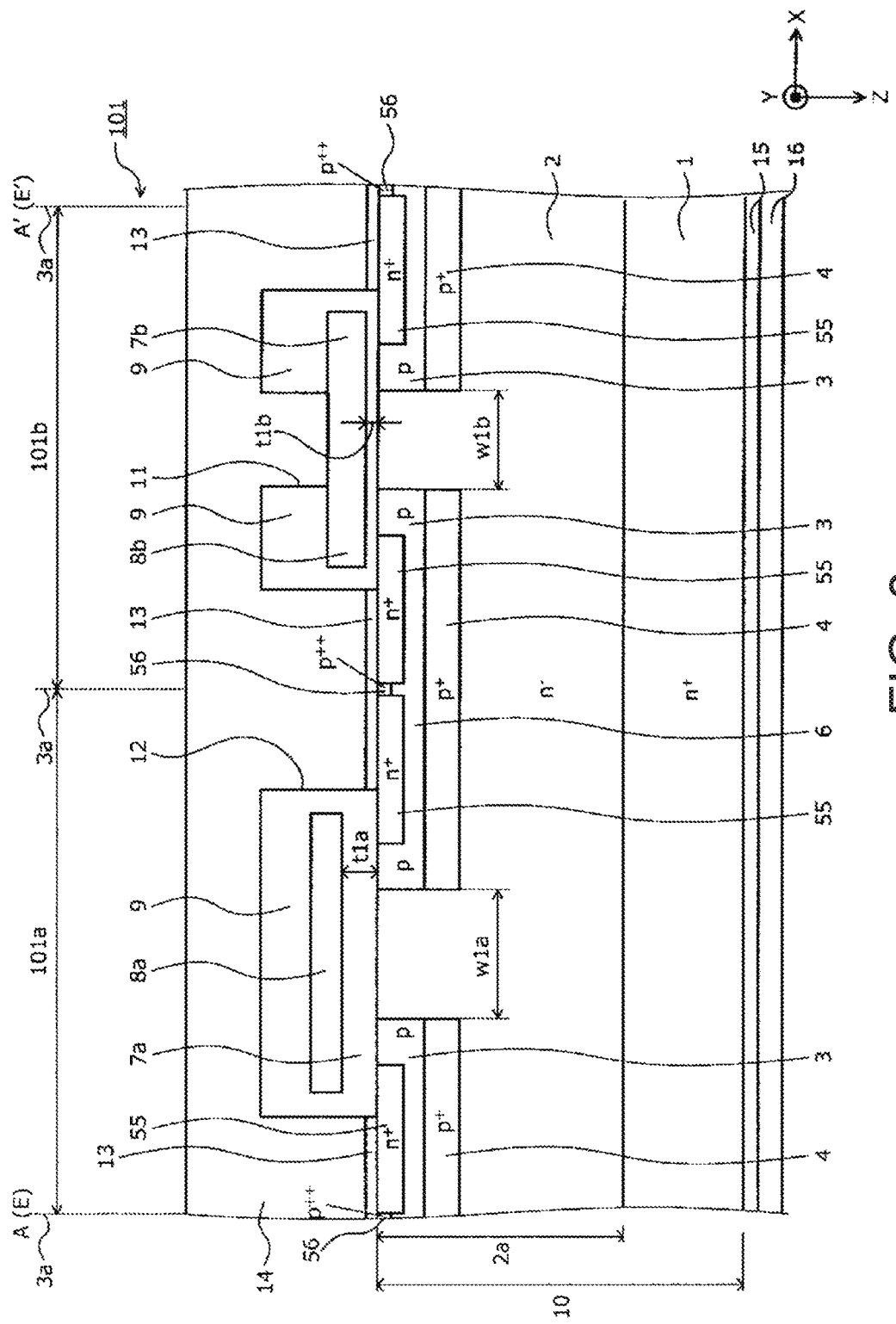
FIG. 8 is a cross-sectional view showing a structure of a semiconductor device of Embodiment 4.
Figure 9:
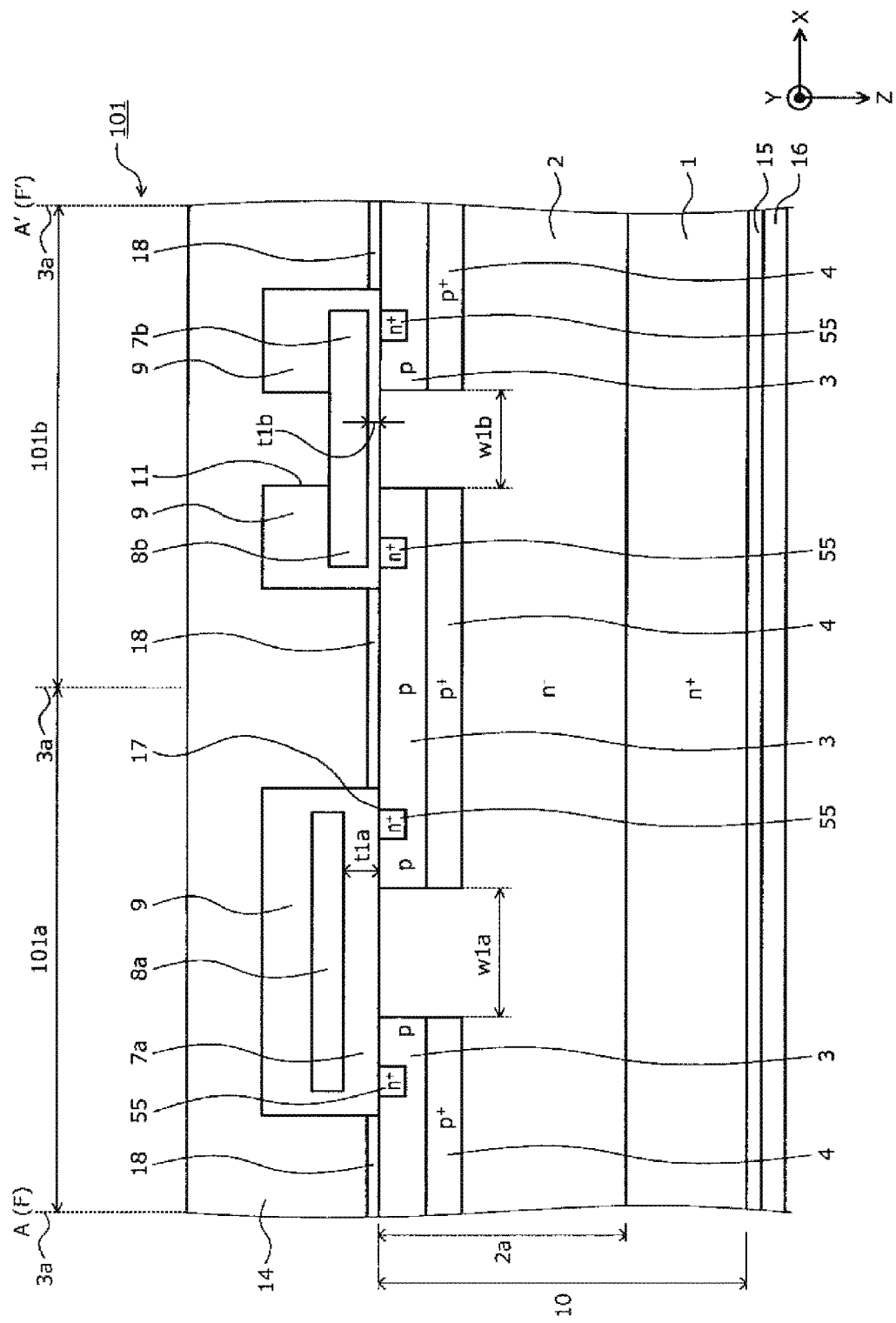
FIG. 9 is a cross-sectional view showing the structure of the semiconductor device of Embodiment 4.
Figure 10:
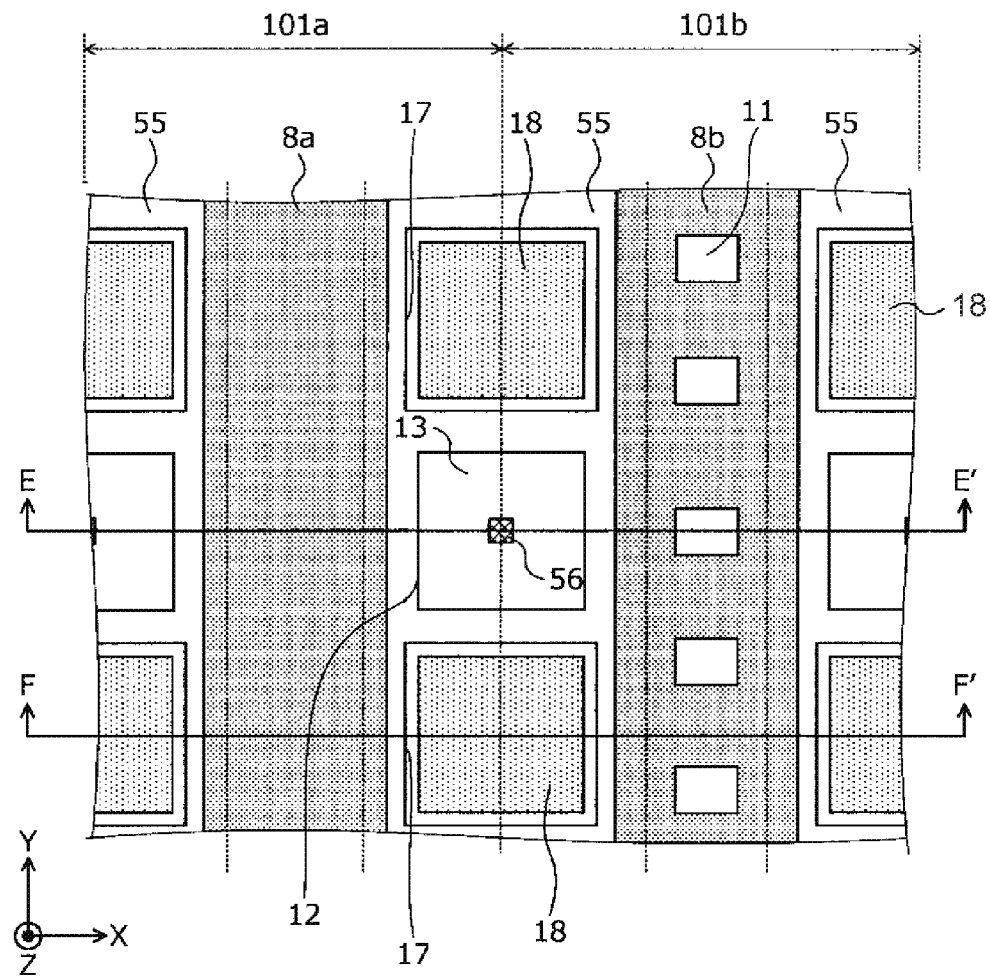
FIG. 10 is a plan view showing a layout of the semiconductor device of Embodiment 4 seen from the front surface side of a semiconductor substrate.

Next, the structure of a semiconductor device of Embodiment 4 will be described. FIGS. 8 and 9 are cross-sectional views showing the structure of the semiconductor device of Embodiment 4. FIGS. 8 and 9 show cross-sectional structures of FIG. 2 along the cutting line A-A'. FIG. 8 shows a cross-sectional structure of FIG. 10 along the cutting line E-E'. FIG. 9 shows a cross-sectional structure of FIG. 10 along the cutting line F-F'. FIG. 10 is a plan view showing the layout of the semiconductor device of Embodiment 4 seen from the front surface side of the semiconductor substrate. FIG. 10 enlarges the area near the cutting line A-A' of FIG. 2. The hatching portions of FIG. 10 are gate electrodes 8a, 8b.

The semiconductor device of Embodiment 4 differs from the semiconductor device of Embodiment 3 in the following two points. The first difference is that, in a portion of an n$^+$ source region 55, there is a portion encircled by the line 17 where the n$^+$ source region 55 is not provided (hereinafter, opening region 17 of n$^+$ source region 55). See, FIGS. 8 to 10. For example, the n$^+$ source region 55, seen from the front surface side of the semiconductor substrate 10, may have a substantially ladder-like planar shape in which the opening regions 17 in the n$^+$ source region 55 are arranged with prescribed gaps therebetween in the second direction Y (see FIG. 10).

For example, in a case in which the n$^+$ source region 55 has a substantially ladder-like planar shape, the opening regions 17 in the n$^+$ source region 55, and the p$^{++}$ contact regions 56, are repeatedly arranged in an alternating manner separated from each other in the second direction Y. In terms of the configuration of the p$^{++}$ contact region 56, a plurality of the p$^{++}$ contact regions 56 are arranged with prescribed gaps therebetween in the second direction Y, similar to Embodiment 3. It is sufficient if the opening region 17 in the n$^+$ source region 55 is provided at least between some of the adjacent p$^{++}$ contact regions 56. The p-type channel region 3 remains in the opening region 17 in the n$^+$ source region 55 in a slit shape that reaches the front surface of the semiconductor substrate 10, and the p-channel region 3 is exposed at the front surface of the semiconductor substrate 10.

The second difference is that the p-type channel regions 3 exposed at the front surface of the semiconductor substrate 10 in the opening region 17 in the n+ source region 55 are connected to the source electrode 14 via Schottky contact electrodes 18 (see FIGS. 9, 10). The Schottky contact electrode 18 forms a Schottky junction with the p-type channel region 3. The region of the p-type channel region 3 where the Schottky junction has been formed with the Schottky contact electrode 18 is a region that limits the injection of holes from the source electrode 14 into the p-type channel region 3 when the drain electrode 16 is caused to function as the source and the source electrode 14 is caused to function as the drain.

The Schottky contact electrodes 18 are disposed separated from the ohmic contact electrodes 13. FIG. 10 shows a case in which the Schottky contact electrodes 18 and the ohmic contact electrodes 13 are repeatedly arranged in an alternating manner separated from each other in the second direction Y; it is sufficient if at least a portion of the p-type channel region 3 is connected to the source electrode 14 via the Schottky contact electrode 18, and the arrangement of the Schottky contact electrodes 18 (in other words, the arrangement of the opening regions 17 in the n$^+$ source region 55) can be modified in various ways.

By providing the Schottky contact electrodes 18, it is possible to suppress the continuous supply of holes from the source electrode 14 to the p-type channel region 3, and to make the supply of holes to the p-type channel region 3 come substantially from only the p$^{++}$ contact regions 56. The material of the Schottky contact electrode 18 may be similar to the material of the ohmic contact electrode 13, for example. The material of the Schottky contact electrode 18 is selected as appropriate in accordance with the impurity concentration of the p-type channel region 3 and the like.

Furthermore, in Embodiment 4, hole current occurring during avalanche breakdown of the first and second cells 101a, 101b is caused to flow to a p-type Schottky diode with a relatively large surface area and made of a p-type channel region and Schottky contact electrode 18. Due to this, it is possible to suppress the operation of the parasitic bipolar transistor of the first and second cells 101a, 101b made of the n$^+$ source region 55, p-type channel region 3, and n$^-$ drift region 2, and possible to suppress a decrease in avalanche resistance. This makes it possible to reduce the area of the p$^{++}$ contact regions 56 significantly more than the p$^{++}$ contact regions 46 in Embodiment 3. In order to lower the operational resistance of the p-type Schottky diode made of the p-type channel region and Schottky contact electrode 18, the portion of the p-type channel region 3 contacting the Schottky contact electrode 18 may have a higher impurity concentration than other portions of the p-type channel region 3.

Furthermore, in an SiC-MOSFET, it is known that there are many interface levels in the interface between gate insulating films 7a, 7b and a silicon carbide part (hereinafter, SiO$_2$/SiC interface). When continuously applying ON/OFF signals to the gate electrodes 8a, 8b, a phenomenon occurs in which a charge pumping effect causes holes to be pulled out from the p-type channel region 3 through the interface levels of the SiO$_2$/SiC interface. Due to this, when the p-type channel region 3 is connected to the source electrode 14 with only a Schottky junction via the Schottky contact electrode 18, the supply of holes from the source electrode 14 to the p-type channel region 3 comes only from the leakage current of the p-type Schottky diode formed at the Schottky junction between the p-type channel region 3 and the Schottky contact electrode 18, and this leakage current is very small. Thus, the p-type channel region 3 becomes a negative voltage, and the gate threshold voltage of the first and second cells 101a, 101b increases.

The p$^{++}$ contact region 56 eliminates this problem, and as long as the p$^{++}$ contact region 56 is connected through the ohmic contact electrode 13 to the source electrode 14 with an ohmic junction, it is possible for holes to be supplied from the source electrode 14 to the p-type channel region 3. It allows the surface area of the p$^{++}$ contact region 56 to be small. The p$^{++}$ contact region 56 need not be provided in cases such as where the leakage current of the p-type Schottky diode formed at the Schottky junction between the p-type channel region 3 and Schottky contact electrode 18 is large, or where there are almost no interface levels of the SiO$_2$/SiC interface and no charge pumping effect.

As described above, Embodiment 4 can obtain effects similar to effects of Embodiments 1 to 3. Furthermore, by providing the p-type Schottky diode made of the p-type channel region and Schottky contact electrode, it is possible to further increase the reverse current amount flowing to the second cell.

Embodiment 5

Figure 11:
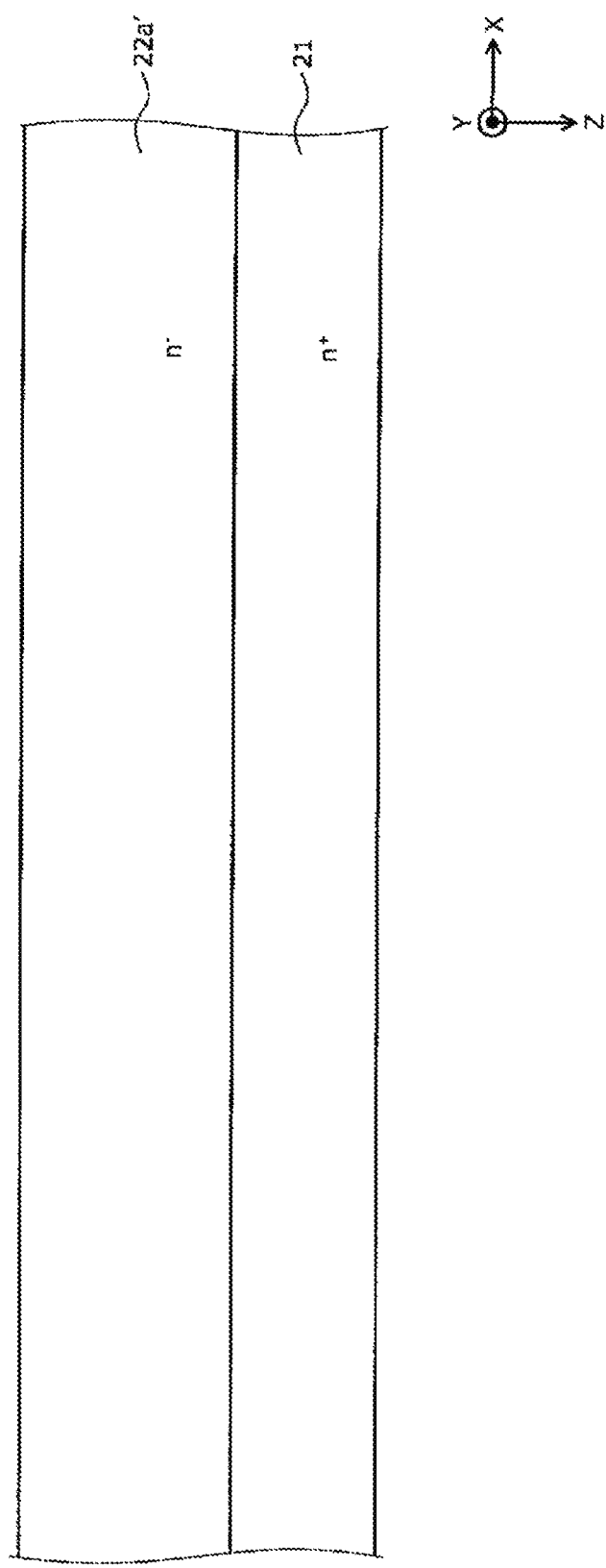
FIG. 11 is a cross-sectional view of the semiconductor device of Embodiment 5 during manufacturing.

Next, an example of a method of manufacturing the semiconductor device as Embodiment 5 will be described in a case in which the semiconductor device of Embodiment 2 is manufactured. FIGS. 11 to 28 are cross-sectional views of the state during the manufacturing of the semiconductor device in Embodiment 5. FIGS. 12 to 28 show only the active region 111. First, as shown in FIG. 11, an n$^-$ silicon carbide layer 22a' is epitaxially grown on the front surface of an n$^+$ starting substrate 21 serving as an n$^+$ drain region.

Although not shown in the drawing, an n-type impurity such as nitrogen (N) may be implanted in the n$^-$ silicon carbide layer 22a' as necessary in order to form an n-type current spreading region (not shown) at a uniform thickness on the surface layer of the n$^-$ silicon carbide layer 22a'. The n-type current spreading region is a so-called current spreading layer (CSL) that reduces spreading resistance of the carriers.

Figure 12:
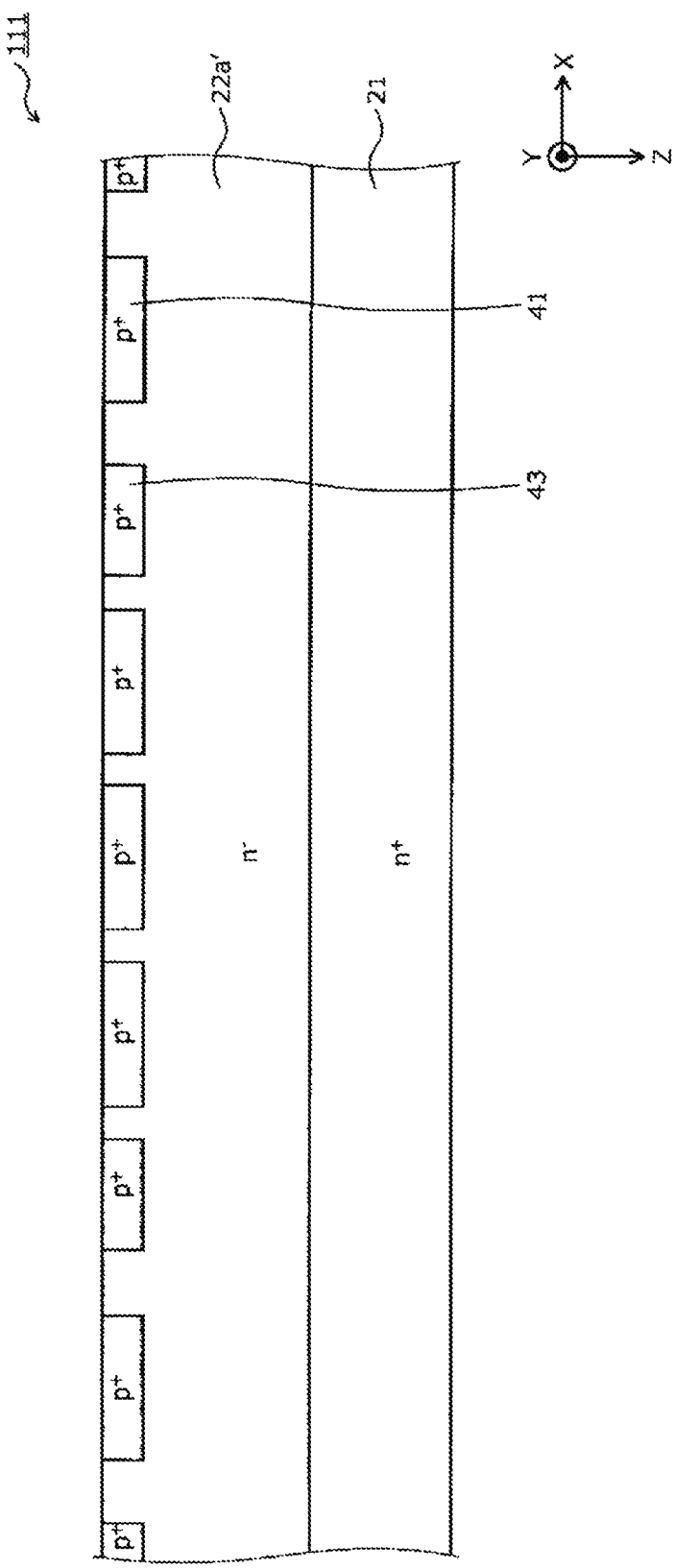
FIG. 12 is a cross-sectional view of the semiconductor device of Embodiment 5 during manufacturing.

Next, as shown in FIG. 12, photolithography and ion implantation of a p-type impurity such as aluminum (Al) are used to selectively form first p$^+$ regions 41 and p$^+$ regions 43 in the surface layer of the n$^-$ silicon carbide layer 22a'. The first p$^+$ regions 41 and p$^+$ regions 43 are repeatedly arranged in an alternating manner in the first direction separated from each other. The p$^+$ region 43 is a part of a second p$^+$ region 42.

Figure 13:
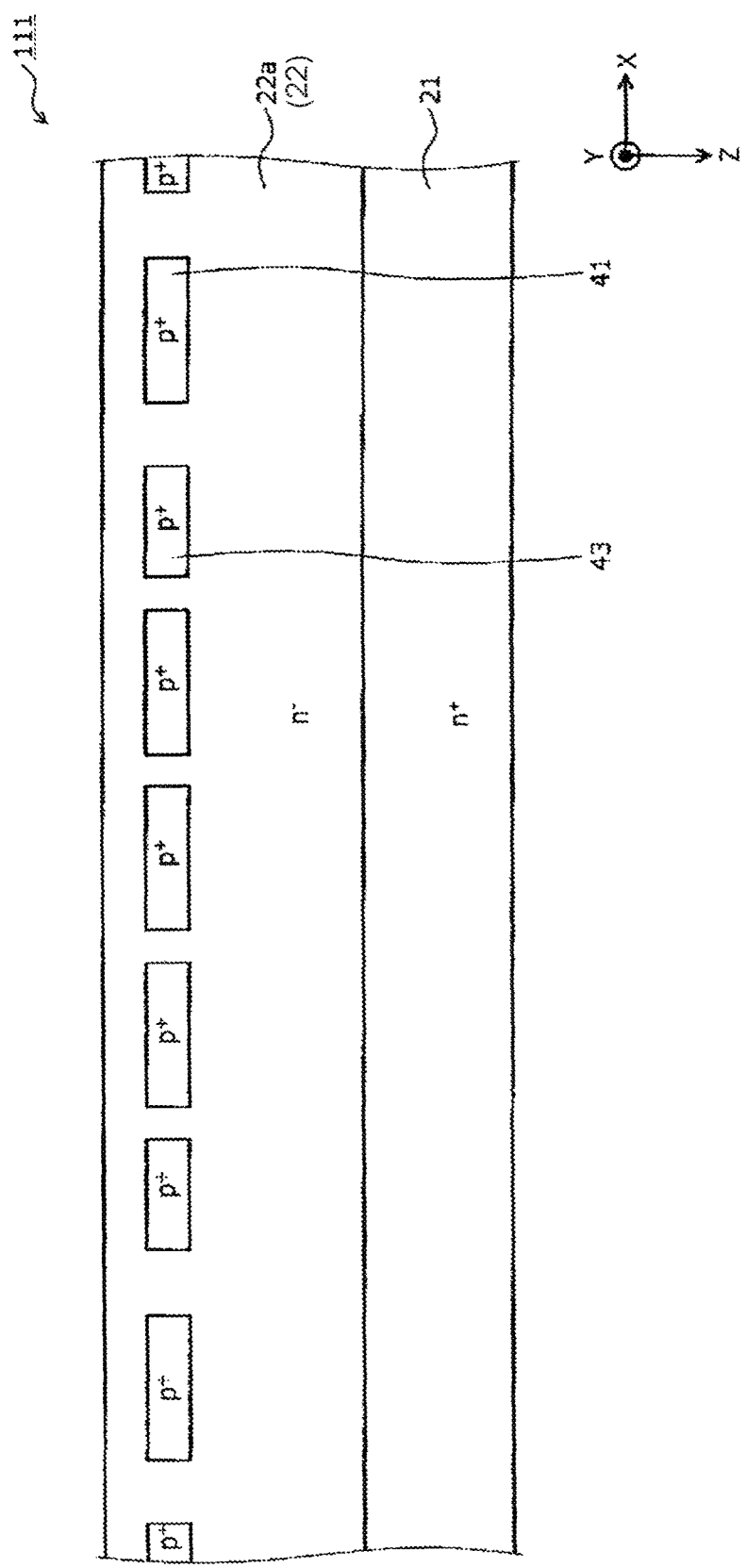
FIG. 13 is a cross-sectional view of the semiconductor device of Embodiment 5 during manufacturing.

Next, as shown in FIG. 13, an n$^-$ silicon carbide layer is further epitaxially grown on the n$^-$ silicon carbide layer 22a' until the thickness thereof reaches the thickness for the n$^-$ drift region 22. Hereafter, the n$^-$ silicon carbide layer 22a' grown to have the thickness of the n$^-$ drift region 22 is shown by reference character 22a. An n-type impurity such as nitrogen (N) may be ion implanted into the n$^-$ silicon carbide layer 22a' as necessary in order to form an n-type current spreading region that reaches the lower layer n-type current spreading region in the front surface layer of the n$^-$ silicon carbide layer 22a.

Figure 14:
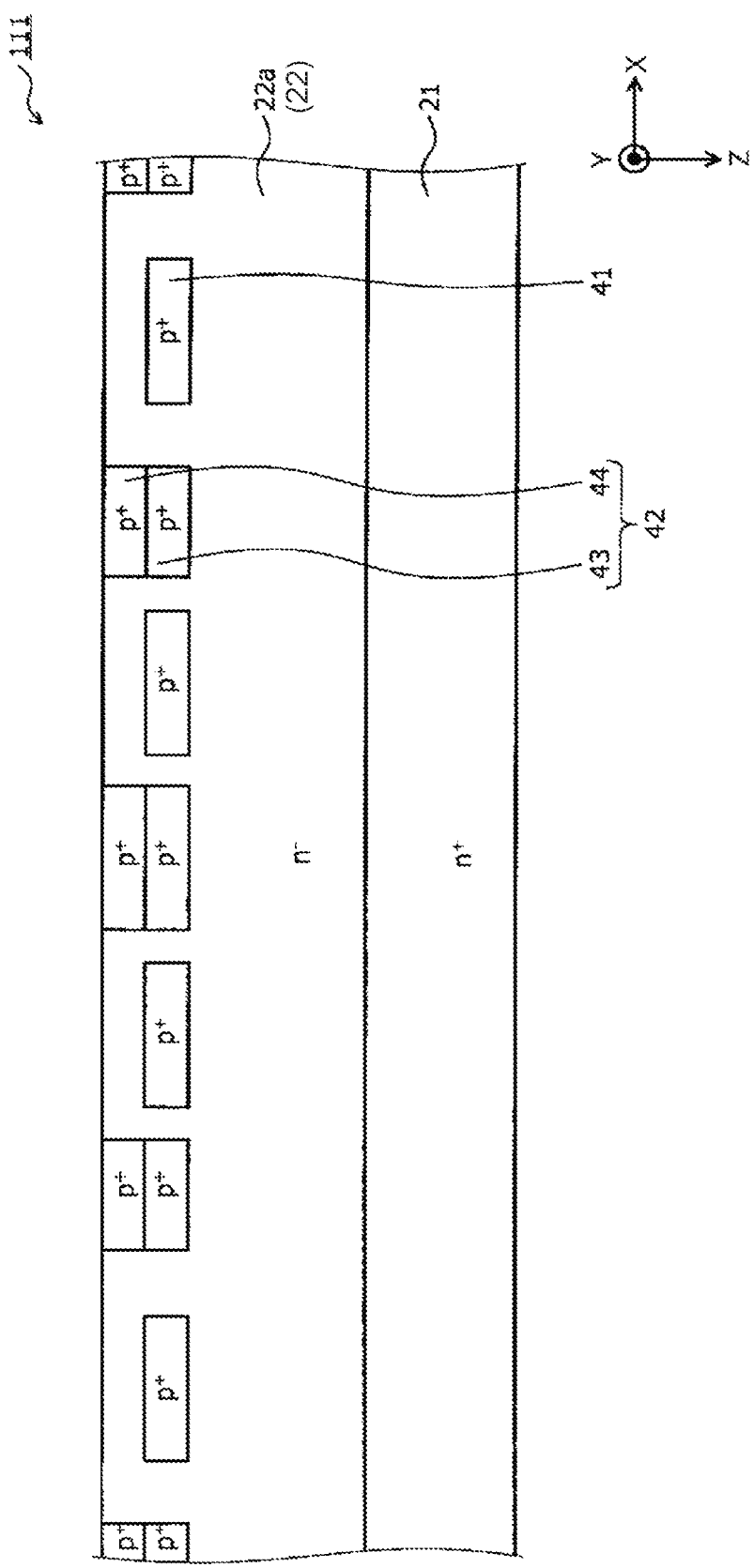
FIG. 14 is a cross-sectional view of the semiconductor device of Embodiment 5 during manufacturing.

Next, as shown in FIG. 14, photolithography and ion implantation of a p-type impurity such as aluminum are used to selectively form p$^+$ regions 44 in the front surface layer of the n$^-$ silicon carbide layer 22a. At such time, the p$^+$ regions 44 are formed in the portions corresponding to the p$^+$ regions 43 at a depth that reaches the p$^+$ regions 43. The width and impurity concentration of the p$^+$ regions 44 are substantially the same as those of the p$^+$ regions 43, for example. The second p$^+$ region 42 is formed by the p$^+$ regions 43, 44 that are connected in the depth direction Z.

The ion implantation for forming the first p$^+$ regions 41 and second p$^+$ regions 42 (p$^+$ regions 43, 44) may be multi-stage ion implantation in which multiple stages (a plurality of rounds) are performed, each with differing acceleration energies and doping concentrations. The step of forming the first p$^+$ regions 41 and p$^+$ regions 43 in the n$^-$ silicon carbide layer 22a' and the step of forming the n-type current spreading region may be switched. The step of forming the p$^+$ regions 44 in the n$^-$ silicon carbide layer 22a and the step of forming the n-type current spreading region may be switched.

Figure 15:
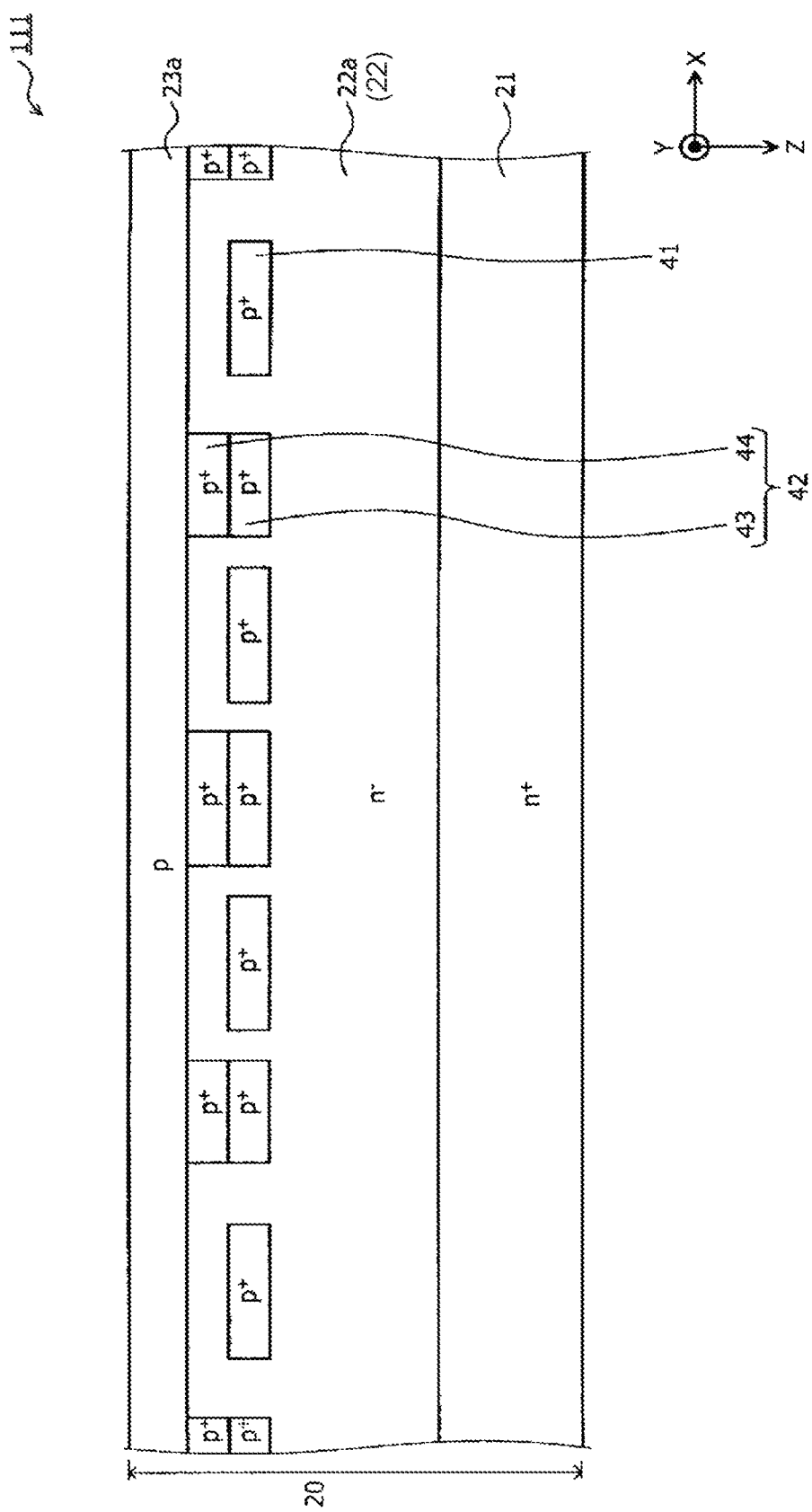
FIG. 15 is a cross-sectional view of the semiconductor device of Embodiment 5 during manufacturing.

Next, as shown in FIG. 15, a p-type silicon carbide layer 23a is epitaxially grown on the n$^-$ silicon carbide layer 22a. The steps up to this point form a semiconductor substrate (semiconductor wafer) 20 in which an n$^-$ silicon carbide layer 22a and a p-type silicon carbide layer 23a have been deposited in this order on an n$^+$ starting substrate 21. Next, although not shown in the drawings, an edge termination region 112 (see FIG. 4) portion of the p-type silicon carbide layer 23a is removed to expose the n$^-$ silicon carbide layer 22a at the front surface of the semiconductor substrate 20 in the edge termination region 112.

Figure 16:
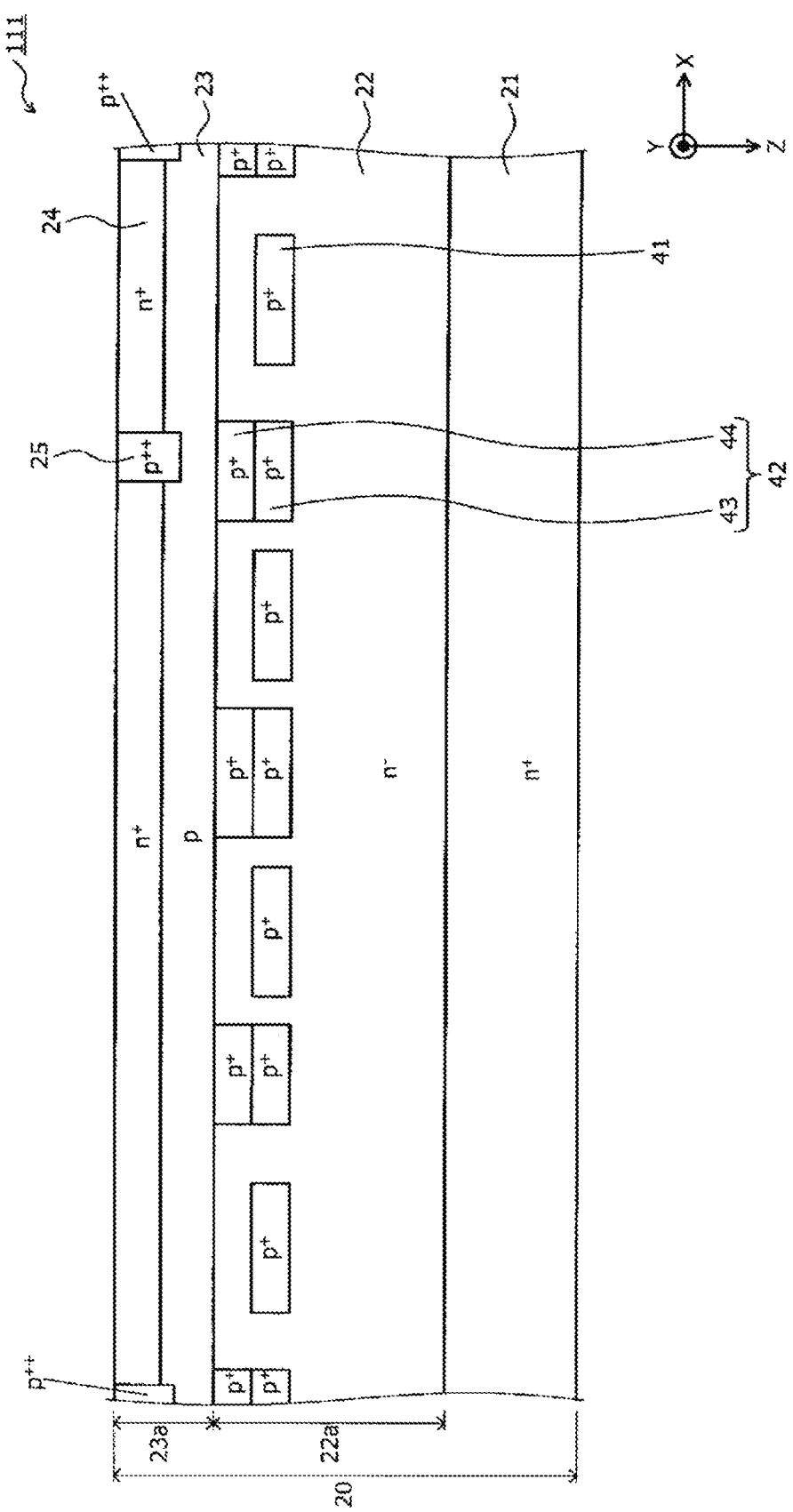
FIG. 16 is a cross-sectional view of the semiconductor device of Embodiment 5 during manufacturing.

Next, as shown in FIG. 16, photolithography and ion implantation of an n-type impurity such as phosphorous (P) or arsenic (As) are used to form an n+ source region 24 in the surface layer of the p-type silicon carbide layer 23a. For example, the entire surface of the p-type silicon carbide layer 23a may be exposed, and a resist mask covering the front surface (entire surface of the n− silicon carbide layer 22a) of the semiconductor substrate 20 in the edge termination region 112 may be used as a mask to form the n+ source region 24 on the entire surface of the p-type silicon carbide layer 23a.

The n+ source region 24 may be formed while the portions corresponding to the formation region of the p++ contact regions 25 are covered by the resist mask used to form the n+ source region 24. In such case, during forming of the n+ source region 24, the n-type impurity is not ion-implanted into the portions of the p-type silicon carbide layer 23a corresponding to the formation regions of the p++ contact regions 25. This makes it possible to keep the dosage amount during ion implantation of the p-type impurity for forming the p++ contact regions 25 low.

Next, photolithography and ion implantation of a p-type impurity such as aluminum are used to selectively form the p++ contact regions 25 contacting the n+ source region 24 in the surface layer of the p-type silicon carbide layer 23a. For example, when the n+ source region 24 is formed in the entire surface of the p-type silicon carbide layer 23a, the p++ contact regions 25 are selectively formed going through the n+ source region 24 in the depth direction Z. The portion of the p-type silicon carbide layer 23a other than the n+ source region 24 and p++ contact region 25 is the p-type channel region 23.

Next, although not shown in the drawings, photolithography and ion implantation of a p-type impurity are used to selectively form a p-type region constituting a withstand-voltage structure in the surface layer of the n− silicon carbide layer 22a exposed to the front surface of the semiconductor substrate 20 in the edge termination region 112. Examples of the p-type region constituting the withstand-voltage structure include a p-type region constituting a guard ring, JTE structure, or the like.

The ion implantation for forming the n+ source region 24, p++ contact regions 25, and p-type regions constituting the withstand-voltage structure may be multi-stage ion implantation. The order of the forming of the n+ source region 24, the forming of the p++ contact region 25, and the forming of the p-type region constituting the withstand-voltage structure may be switched. Next, the impurities that have been ion-implanted into the semiconductor substrate 20 through the steps up to this point are activated by a heat treatment for approximately three minutes at a temperature of 1700° C., for example.

Figure 17:
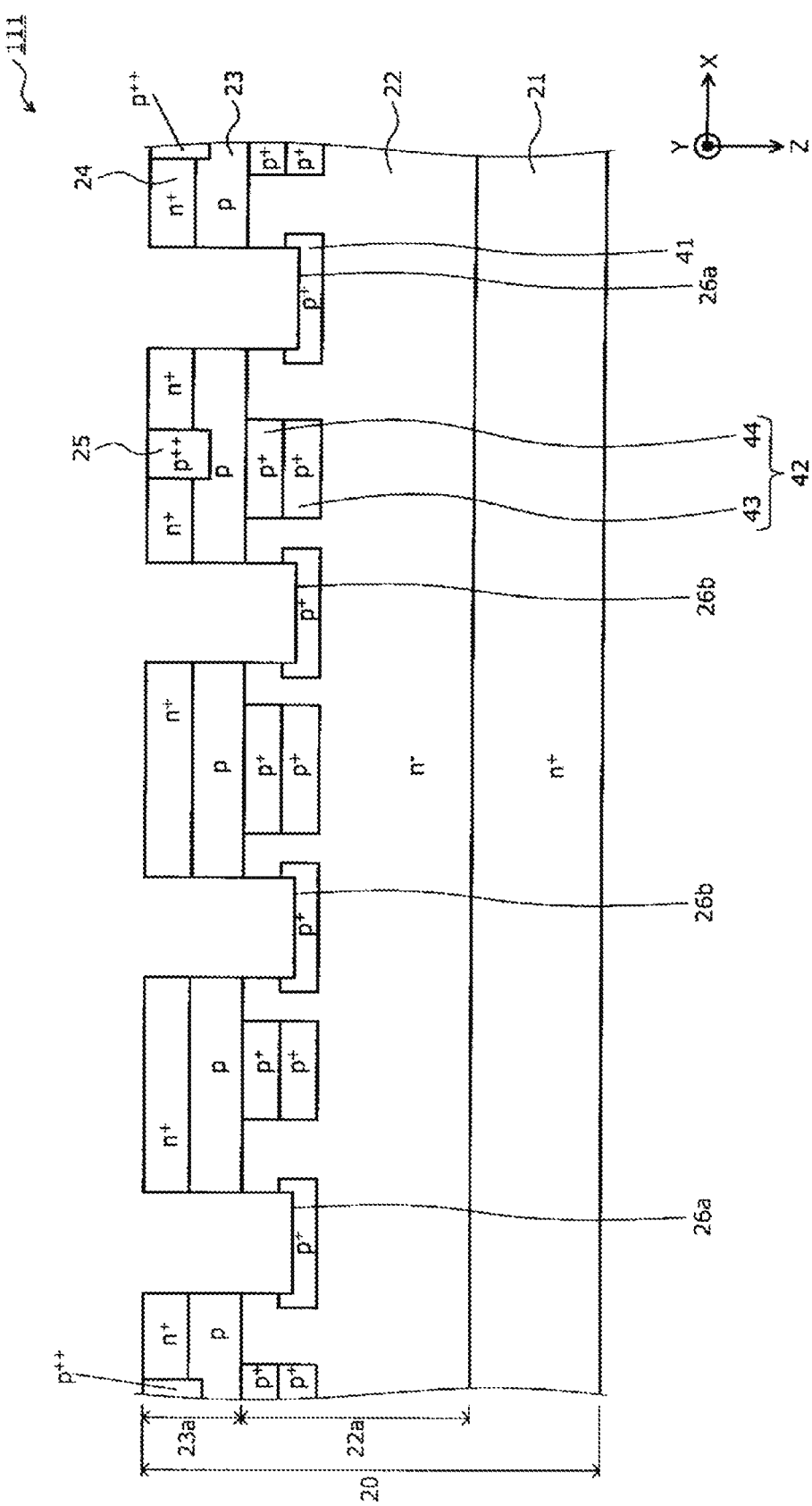
FIG. 17 is a cross-sectional view of the semiconductor device of Embodiment 5 during manufacturing.
Figure 18:
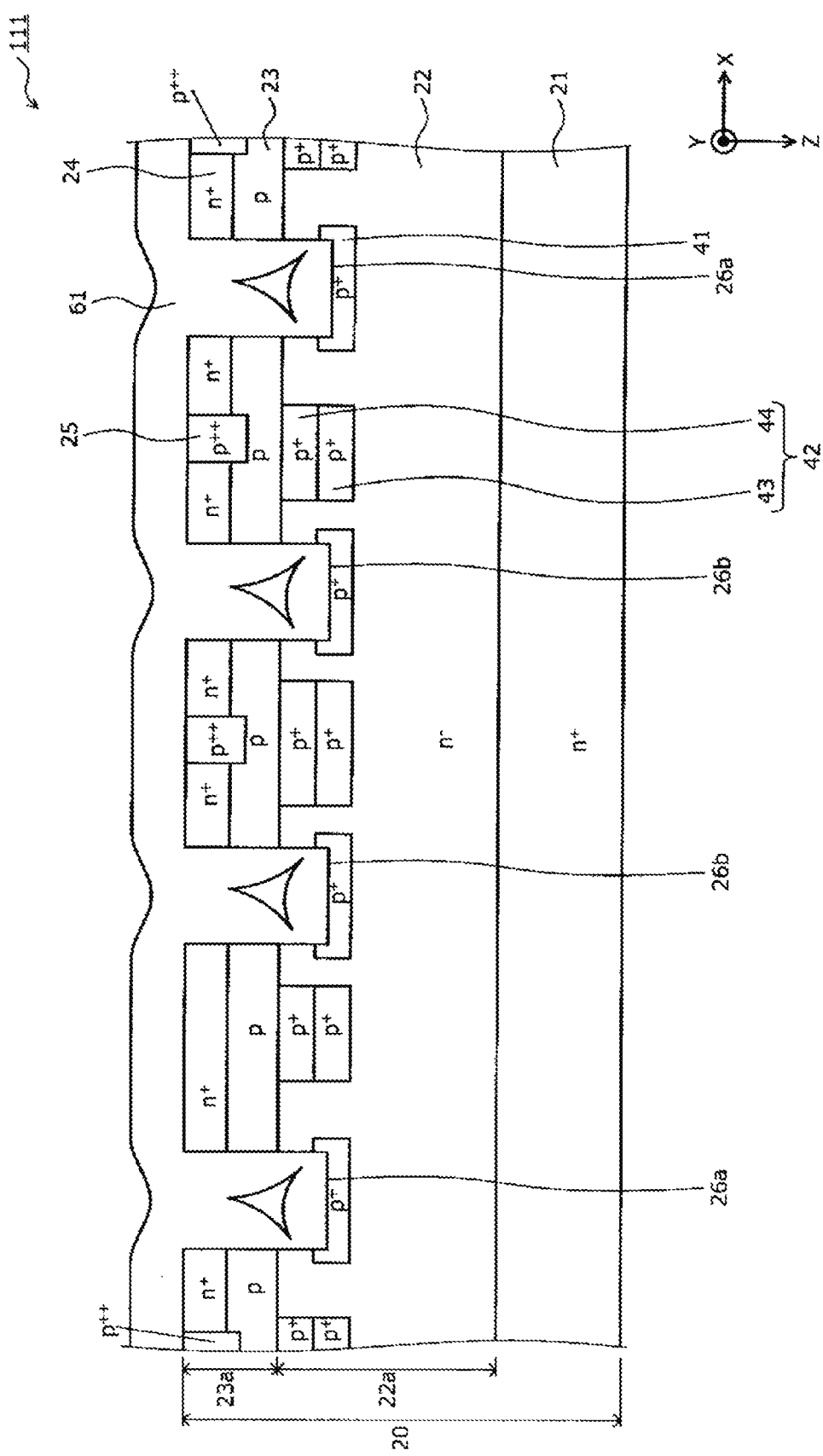
FIG. 18 is a cross-sectional view of the semiconductor device of Embodiment 5 during manufacturing.

Next, as shown in FIG. 17, photolithography and etching are used to form first and second trenches 26a, 26b going through the n+ source region 24 and p-type channel region 23 to reach the first p+ region 41. Next, as shown in FIG. 18, chemical vapor deposition (CVD) is used to deposit an oxide film 61 on the front surface of the semiconductor substrate 20, so that the first and second trenches 26a, 26b are filled in with the oxide film 61.

Figure 19:
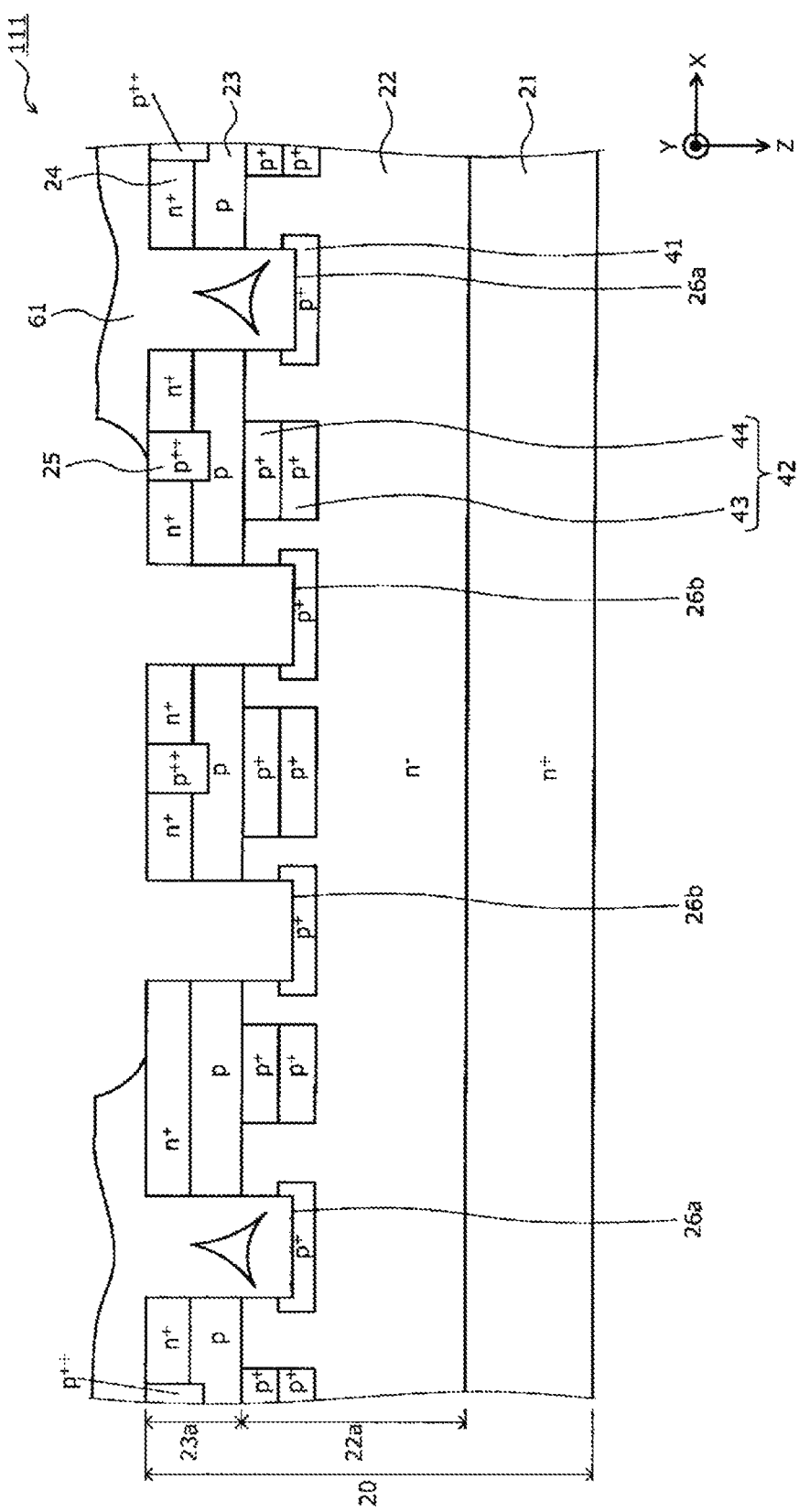
FIG. 19 is a cross-sectional view of the semiconductor device of Embodiment 5 during manufacturing.

The oxide film 61 is used as a mask during a step that will be described later. Due to this, it is sufficient if the openings of the first and second trenches 26a, 26b are blocked by the oxide film 61, and cavities (substantially triangular portions in FIG. 18) may be generated inside the oxide film 61 in the portion filling in the first and second trenches 26a, 26b. Next, as shown in FIG. 19, photolithography and wet etching, for example, are used to remove the portions of the oxide film 61 in second trenches 26b and at the periphery of the second trenches 26b.

Figure 20:
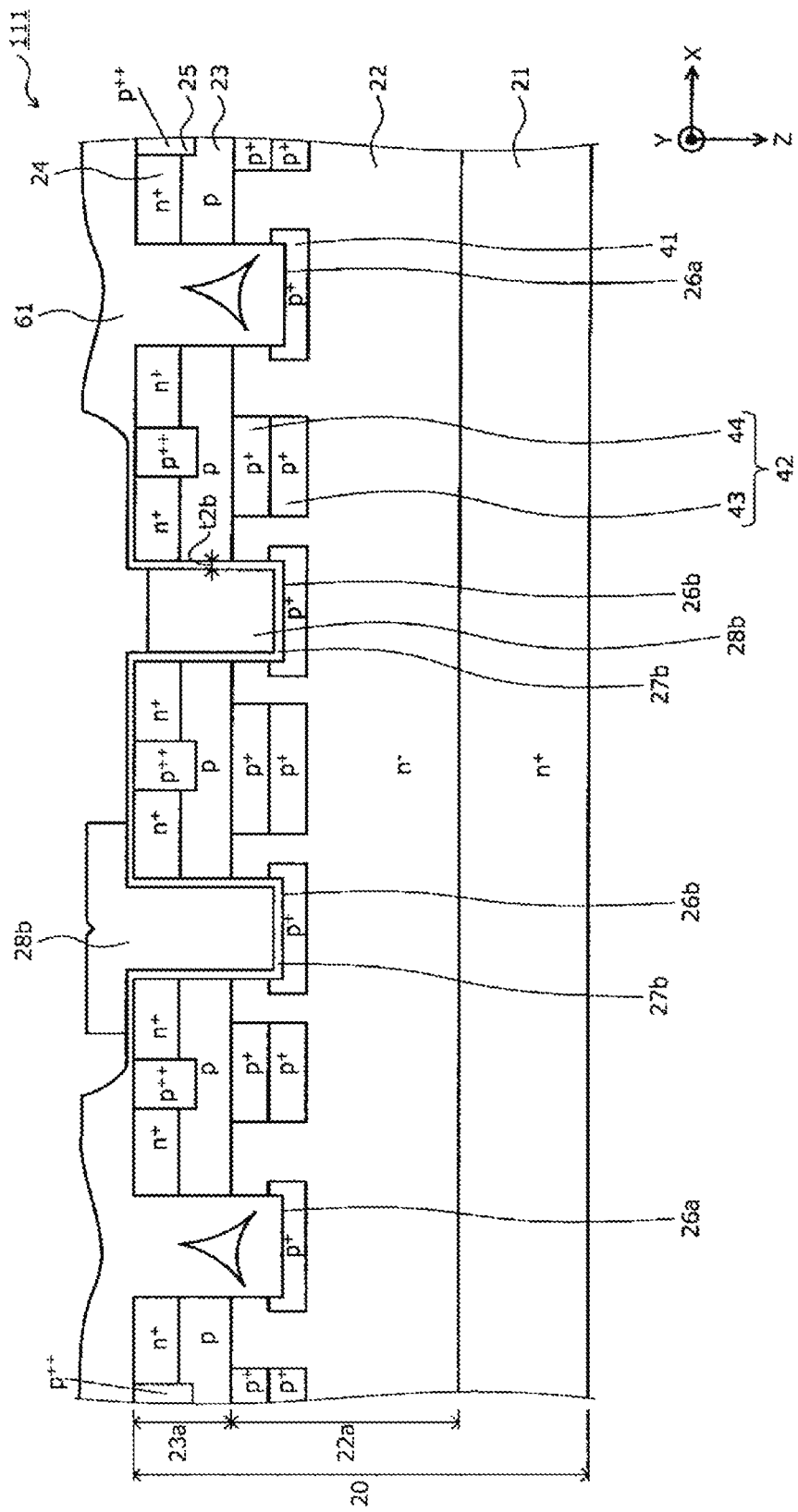
FIG. 20 is a cross-sectional view of the semiconductor device of Embodiment 5 during manufacturing.

Next, as shown in FIG. 20, a high temperature oxide (HTO) film is deposited at a thickness t2b of approximately 30 nm, for example, as the gate insulating film 27b on the front surface of the semiconductor substrate 20 exposed to the openings in the oxide film 61 and on the inner walls of the second trenches 26b. This forms the gate insulating film 27b along the inner walls of the second trenches 26b. Next, a heat treatment is performed at a temperature of approximately 1300° C. in a nitric oxide (NO) gas atmosphere, for example, to improve interface characteristics between the gate insulating film 27b and a silicon carbide part (the inner walls of the second trenches 26b).

Next, a phosphorous-doped polysilicon layer is deposited on the front surface of the semiconductor substrate 20 and filled into the second trenches 26b. Next, the polysilicon layer is selectively removed by photolithography and etching to leave portions that will serve as the gate electrodes 28b of the polysilicon layer inside the second trenches 26b. At such time, the upper surface of the gate electrode 28b may be positioned inside the second trench 26b (the gate electrode 28b on the right side in FIG. 20), or the upper surface of the gate electrode 28b may protrude outside (upward) from the front surface of the semiconductor substrate 20 (the gate electrode 28b on the left side in FIG. 20).

Figure 21:
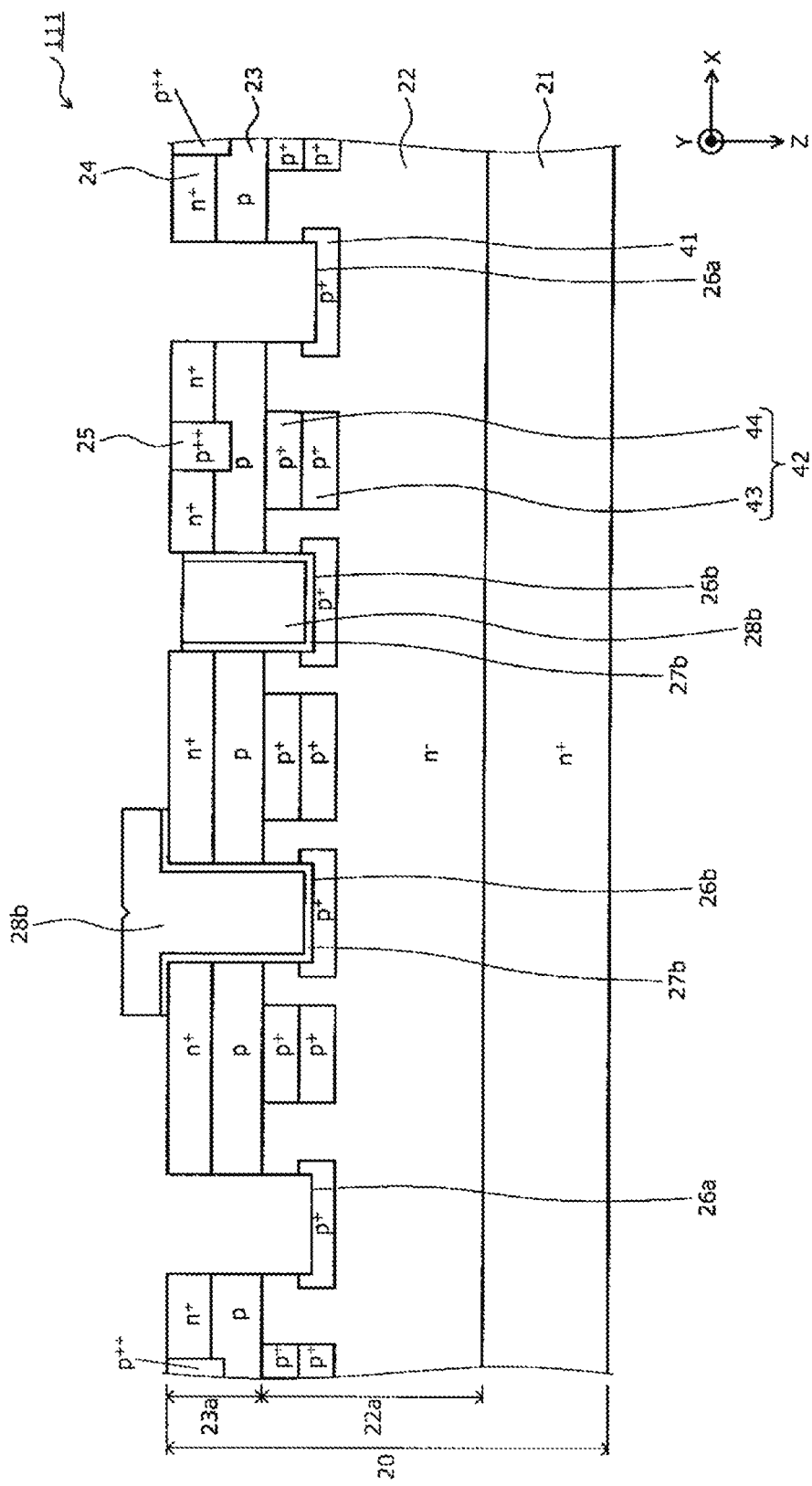
FIG. 21 is a cross-sectional view of the semiconductor device of Embodiment 5 during manufacturing.
Figure 22:
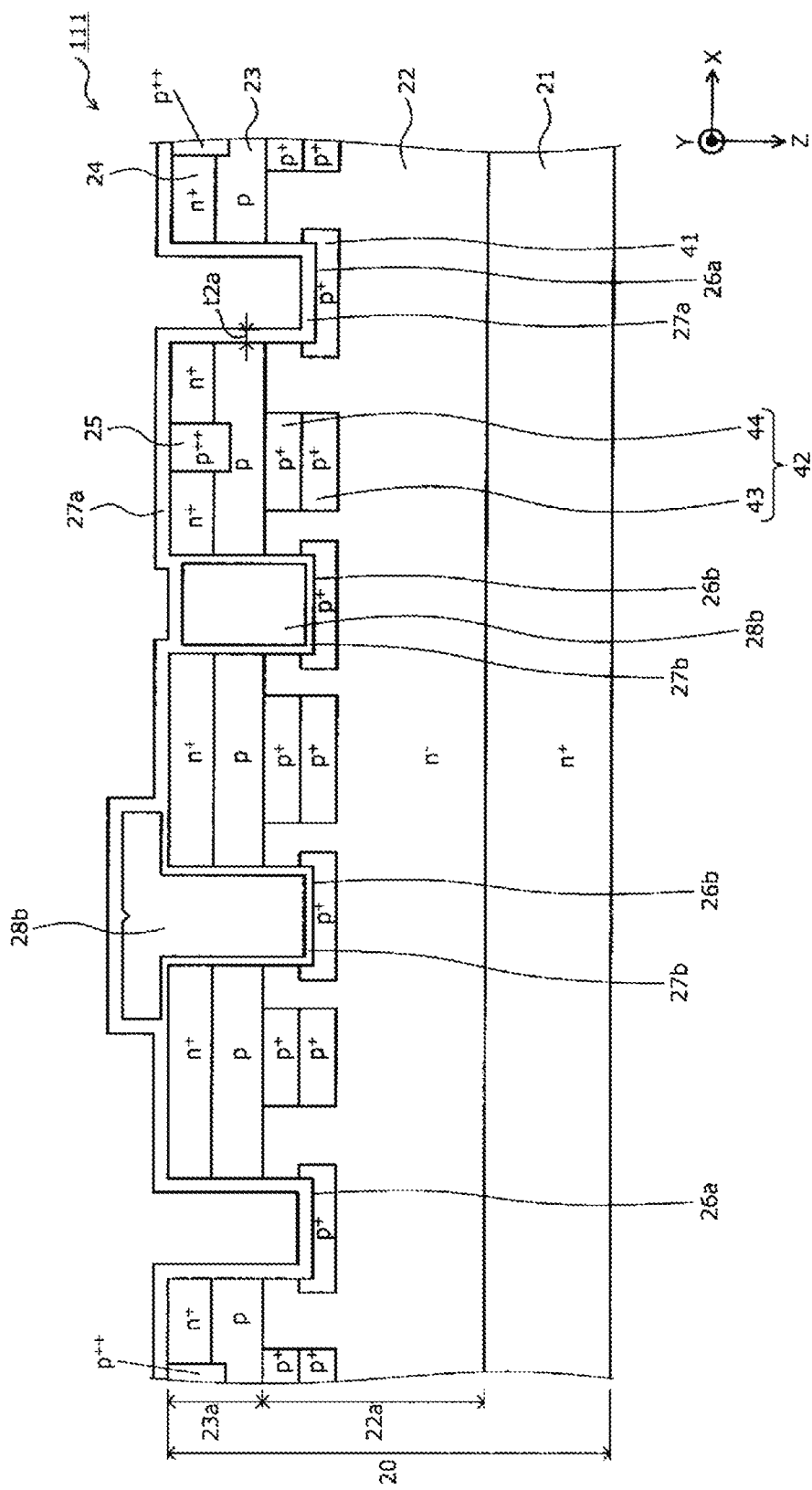
FIG. 22 is a cross-sectional view of the semiconductor device of Embodiment 5 during manufacturing.

Next, as shown in FIG. 21, the remaining portions of the oxide film 61 and the exposed portions of the gate insulating film 27b not covered by the gate electrodes 28b are removed by wet etching, for example. This exposes the inner walls of the first trenches 26a. Next, as shown in FIG. 22, an HTO film is deposited at a thickness t2a of approximately 60 nm for example, as a gate insulating film 27a on the front surface of the semiconductor substrate 20 and on the inner walls of the first trenches 26a. This forms the gate insulating film 27a along the inner walls of the first trenches 26a. Next, a heat treatment is performed at a temperature of approximately 1300° C. in a nitric oxide (NO) gas atmosphere, for example, to improve interface characteristics between the gate insulating film 27a and a silicon carbide part (the inner walls of the first trenches 26a).

Figure 23:
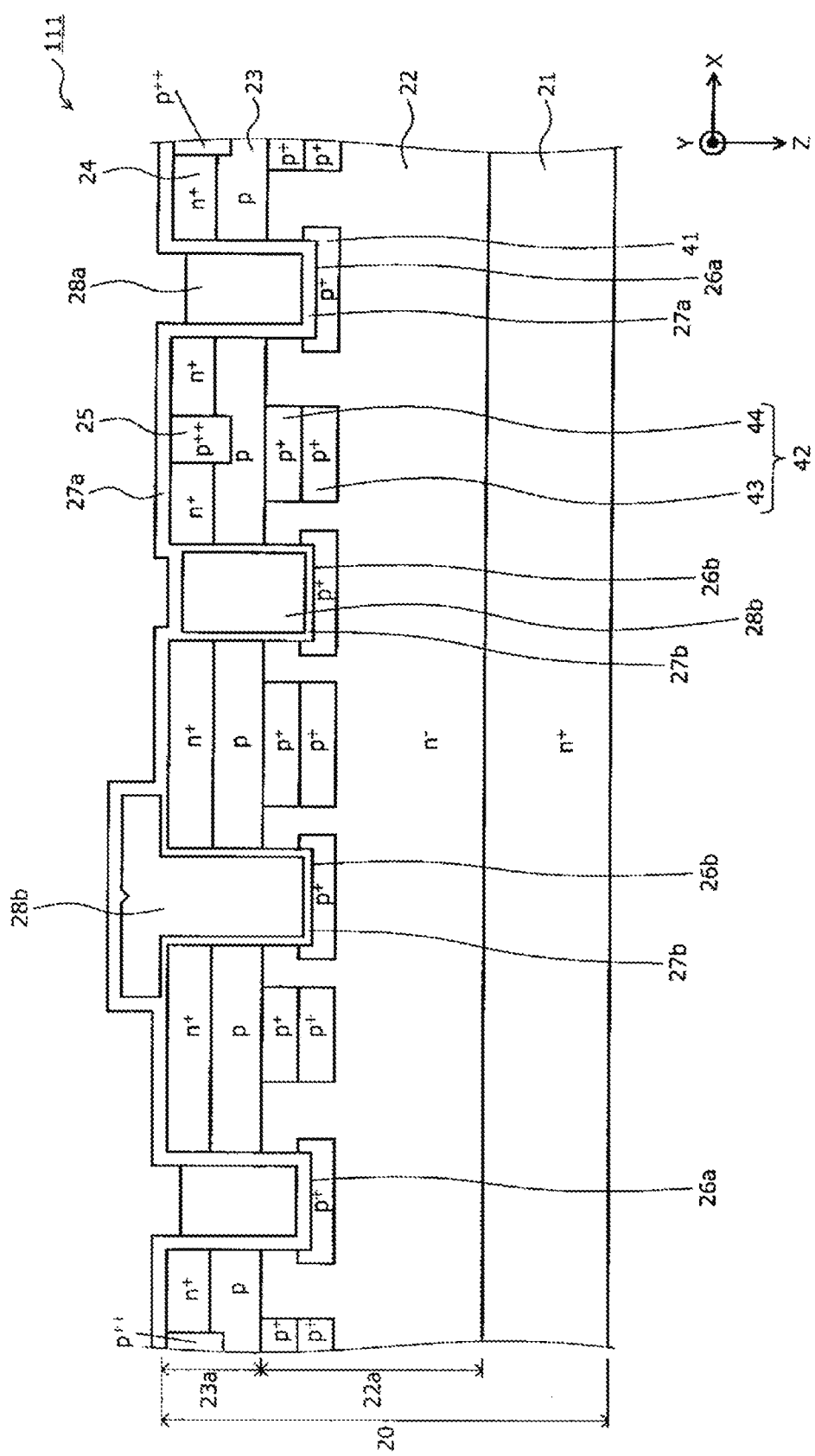
FIG. 23 is a cross-sectional view of the semiconductor device of Embodiment 5 during manufacturing.

Next, as shown in FIG. 23, a boron (B)-doped polysilicon layer is deposited on the front surface of the semiconductor substrate 20 and filled into the first trenches 26a. Then, the polysilicon layer is selectively removed by photolithography and etching to leave portions that will serve as the gate electrodes 28a of the polysilicon layer inside the first trenches 26a. The gate electrode 28a does not connect to the source electrode 14, and thus it is not necessary to have a partial protrusion outside (upward) from the front surface of the semiconductor substrate 20 as with the gate electrode 28b.

Figure 24:
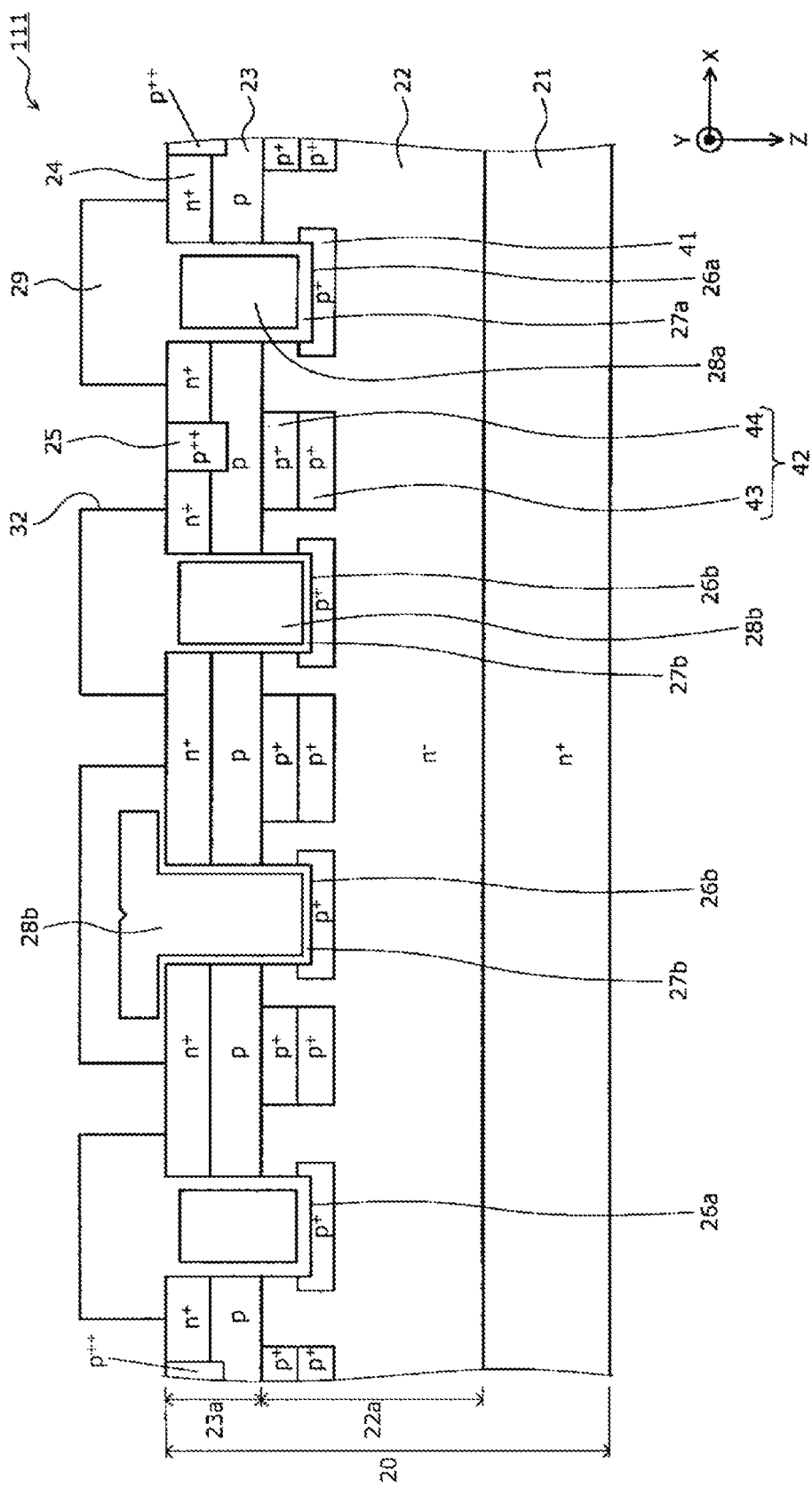
FIG. 24 is a cross-sectional view of the semiconductor device of Embodiment 5 during manufacturing.

Next, as shown in FIG. 24, in order to cover the gate electrodes 28a, 28b, a borophosphosilicate glass (BPSG) film, for example, is deposited as an interlayer insulating film 29 on the entire front surface of the semiconductor substrate 20. Then, photolithography and etching are used to selectively remove the interlayer insulating film 29 and gate insulating film 27a to form contact holes 32 and expose the n+ source regions 24 and p++ contact regions 25 in the contact holes 32. Thereafter, a heat treatment (reflow) is performed on the interlayer insulating film 29 at a temperature of 950° C., for example, to planarize the film.

Figure 25:
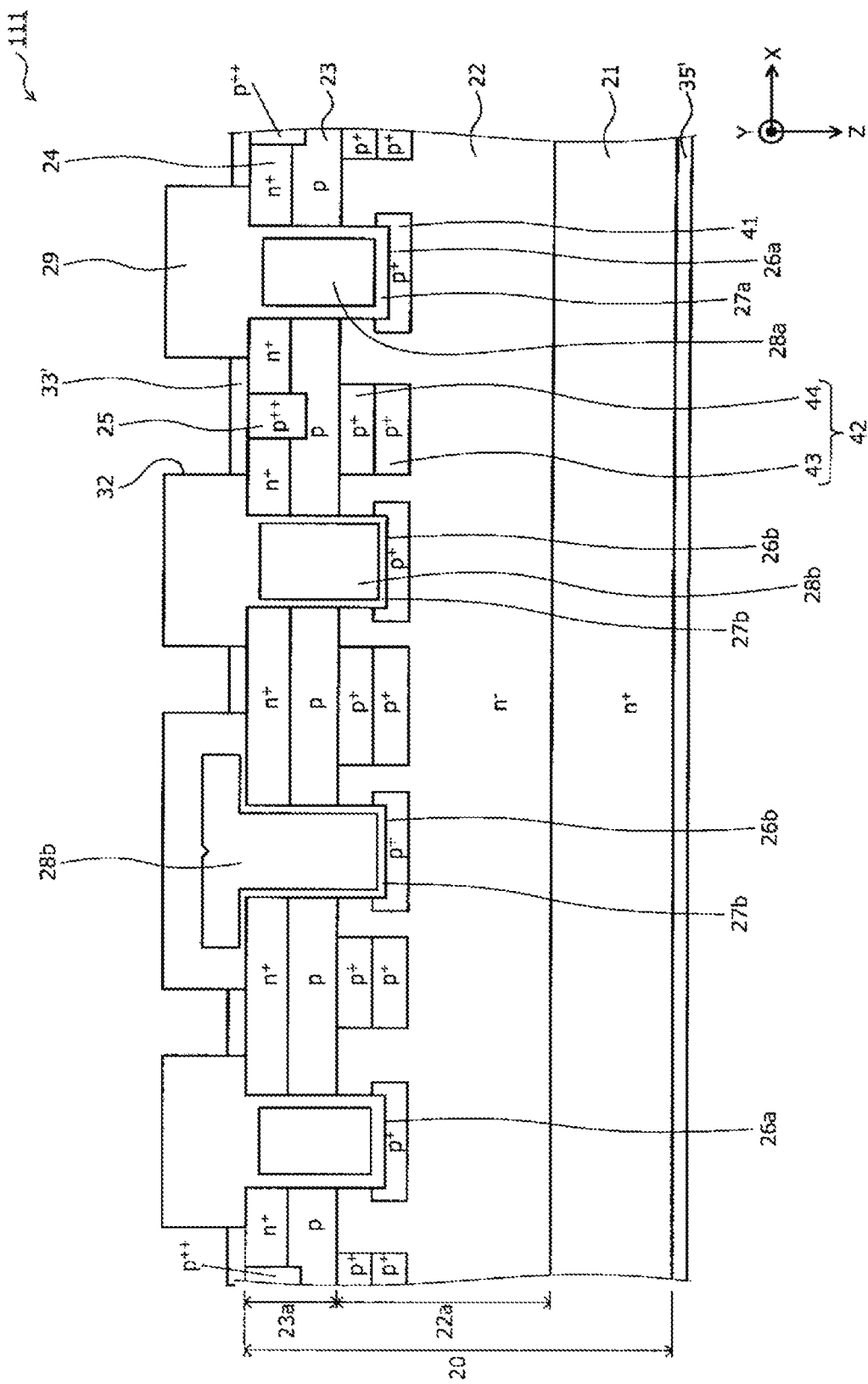
FIG. 25 is a cross-sectional view of the semiconductor device of Embodiment 5 during manufacturing.
Figure 26:
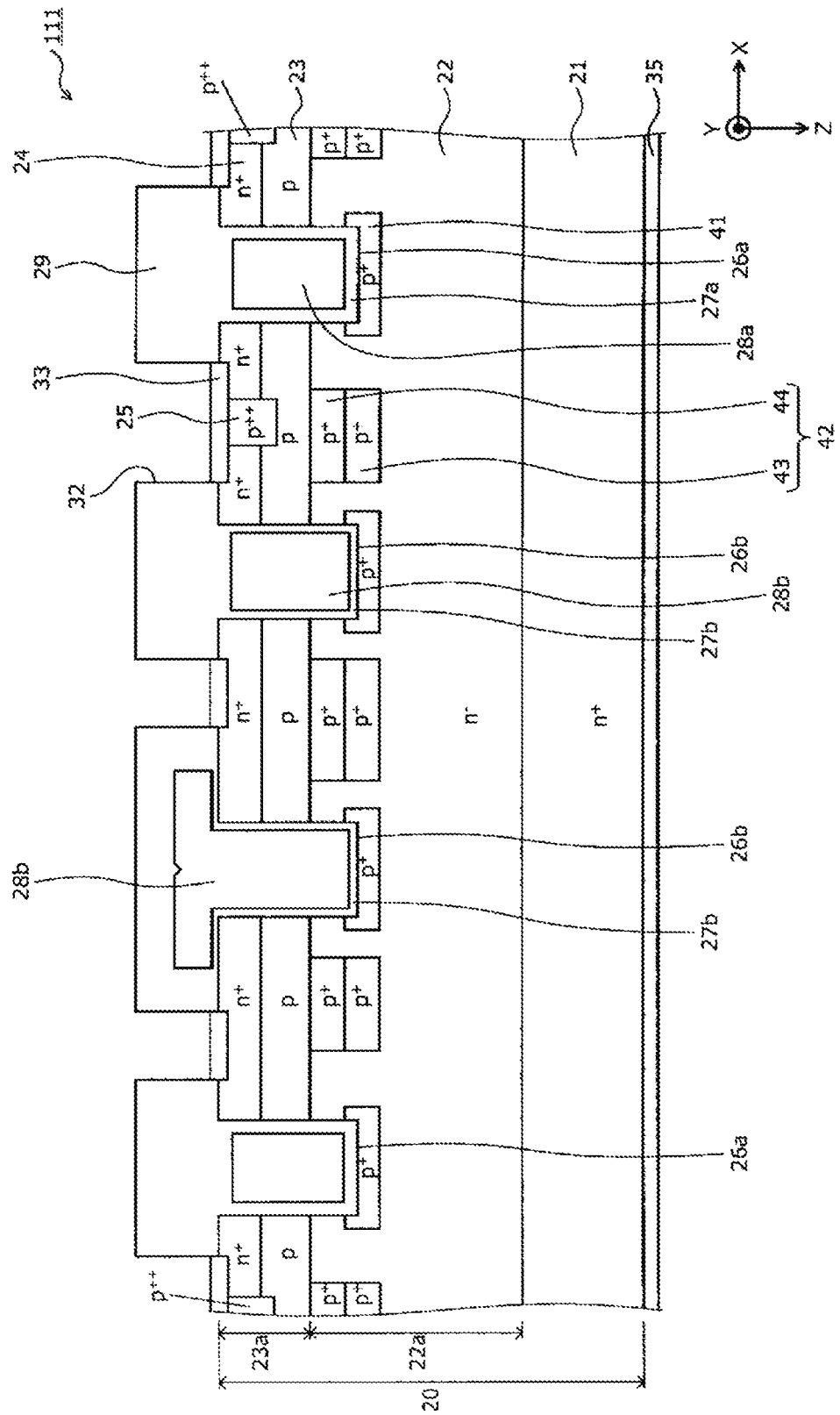
FIG. 26 is a cross-sectional view of the semiconductor device of Embodiment 5 during manufacturing.

Next, as shown in FIG. 25, nickel (Ni) films 33', 35', for example, are respectively deposited on the front surface and rear surface of the semiconductor substrate 20. Then, photolithography and etching are used to selectively remove the nickel film 33', so that the nickel film 33' remains only inside the contact holes 32. Next, as shown in FIG. 26, a heat treatment is performed at a temperature of approximately 975° C., for example, to silicide the nickel films 33', 35', so that ohmic contact electrodes 33, 35, which are nickel silicide (NiSi) layers, are respectively formed on the rear surface of the n⁺ starting substrate 21 and on the front surface of the p⁺⁺ contact regions 25 and n⁺ source regions 24 exposed to the contact holes 32.

Figure 27:
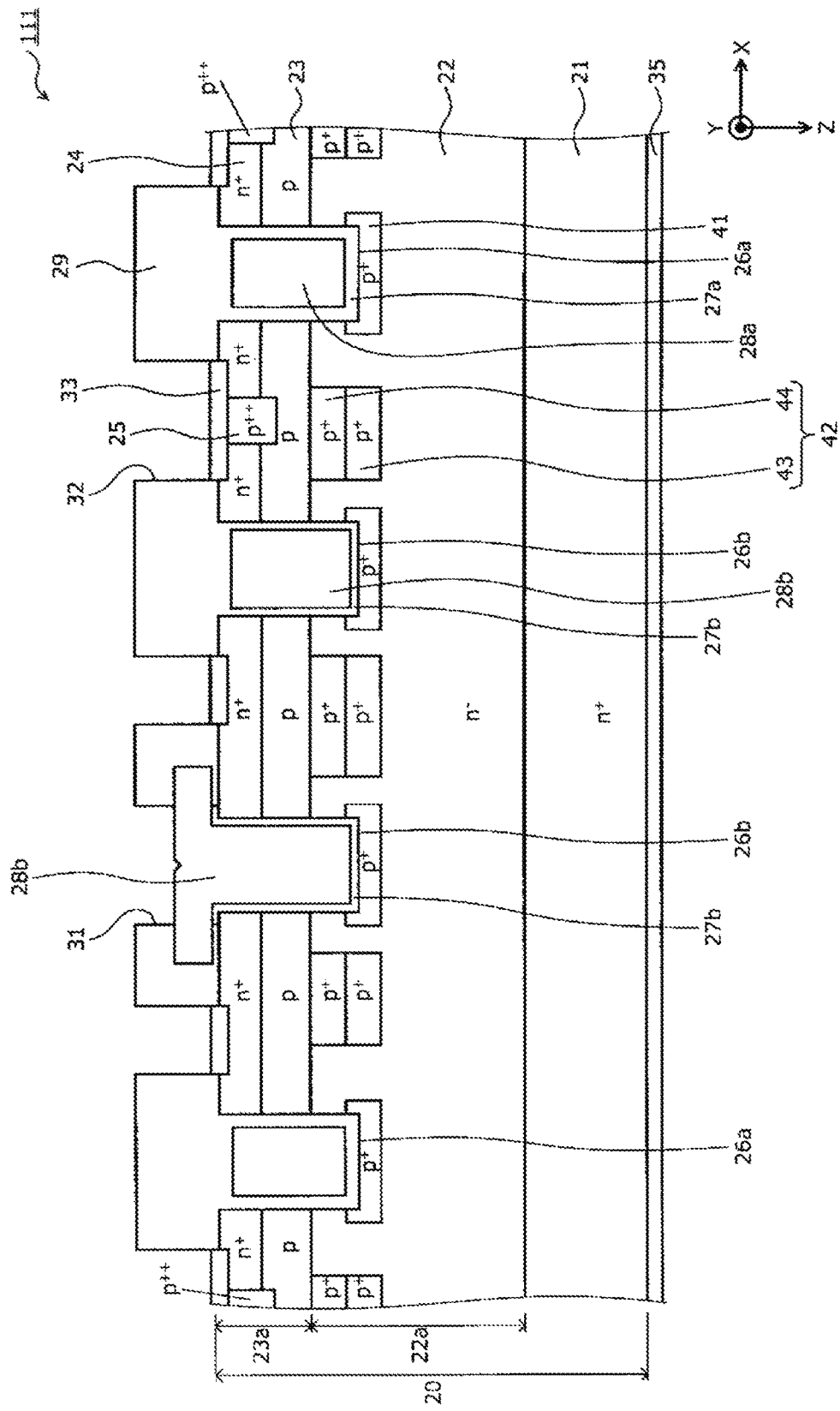
FIG. 27 is a cross-sectional view of the semiconductor device of Embodiment 5 during manufacturing.
Figure 28:
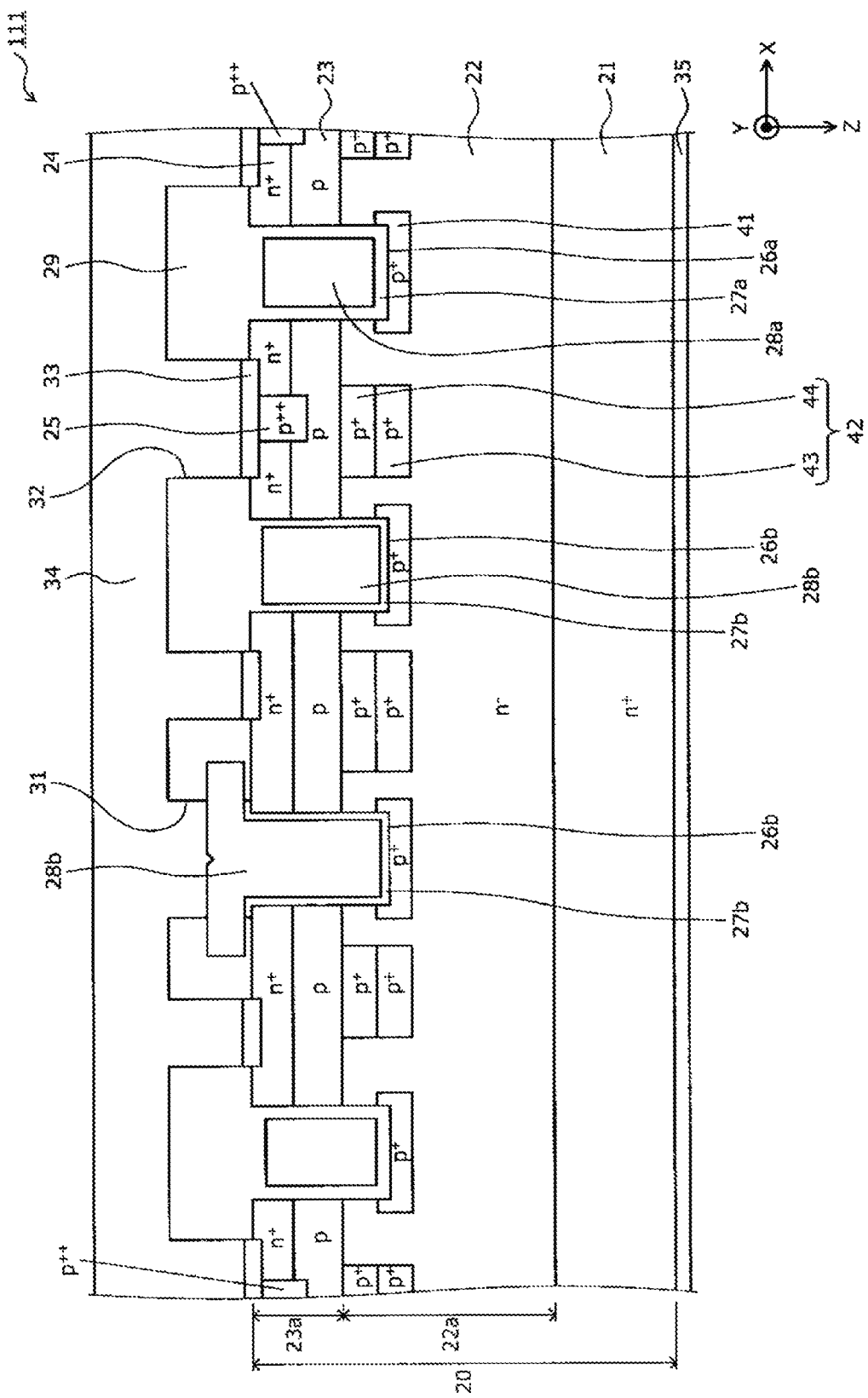
FIG. 28 is a cross-sectional view of the semiconductor device of Embodiment 5 during manufacturing.

Next, as shown in FIG. 27, photolithography and etching are used to selectively remove the interlayer insulating film 29, and forming a contact hole (not shown) for contact with a gate pad 114 (see FIG. 4) and contact holes 31 for partially exposing the gate electrodes 28b. Then, as shown in FIG. 28, an electrode layer containing aluminum, for example, is deposited on the front surface of the semiconductor substrate 20 so as to fill in the contact holes. Thereafter, photolithography and etching are used to selectively remove the electrode layer on the front surface of the semiconductor substrate 20 for separating the electrode layer into a source electrode 34 and gate pad 114 (not shown in FIG. 28).

Next, a polyimide protective film is coated as a surface protective film on the front surface of the semiconductor substrate 20. Then, photolithography and etching are used to remove a portion of the polyimide protective film on the source electrode 34 and gate pad 114. Next, the drain electrode 36 is formed by depositing a titanium (Ti) film, nickel film, and gold (Au) film, for example, in this order on the ohmic contact electrode 35 on the rear surface of the semiconductor substrate 20. Thereafter, the semiconductor substrate 20 (semiconductor wafer) is cut into individual chip-sized pieces to complete the SiC-MOSFET shown in FIGS. 3 and 4.

Embodiment 5 can be applied to Embodiments 1, 3, and 4. In such case, in the method of manufacturing the semiconductor device of Embodiment 5 described above, a planar gate structure MOS gate is formed instead of forming a trench gate structure MOS gate.

Embodiment 5 described above can be applied to Embodiments 1 to 4.

The present invention as described above is not limited to the aforementioned embodiments, and various modifications can be made without departing from the spirit of the present invention. For example, in the respective embodiments described above, various modifications can be performed in accordance with the desired specifications or the like, such as the dimensions of the respective components, the impurity concentrations, the materials, and the like. Furthermore, the drawings are schematic, and the thickness or dimensions etc. of the respective parts, or the proportions of the dimensions among the respective parts, etc. can differ in practice. In addition, in the respective embodiments described above, examples were described in which the potential of the gate electrode of the second cell was fixed to the potential of the source electrode, but the potential of the gate electrode of the second cell may be set to any potential except the potential of the gate electrode of the first cell as long as the potential of the surface inversion layer of the p-channel region of the second cell can be made lower than the potential of the surface inversion layer of the p-type channel region of the first cell when a negative bias is applied to the gate electrode of the first cell.

In the respective embodiments described above, a silicon carbide epitaxial substrate on which a silicon carbide epitaxial layer was deposited on a silicon carbide substrate was used as an example for explanation, but the present invention is not limited to this, and all regions constituting the device may be spreading regions formed by ion implantation inside the silicon carbide substrate, for example. Furthermore, the present invention is also applicable to wide bandgap semiconductors (such as gallium (Ga)) other than silicon carbide. The present invention is the same even if the conductivity types (n-type, p-type) are inverted. For example, in the respective embodiments described above, when the conductivity types are inverted to form a p-channel type SiC-MOSFET, the gate electrode of the second cell may be formed of a material with a lower Fermi level than the gate electrode of the first cell if forming the gate electrodes of the first and second cells of materials with differing Fermi levels.

INDUSTRIAL APPLICABILITY

As described above, the semiconductor device of the present invention is useful for semiconductor devices used in power convertors such as inverters, power supply devices for switching, and the like.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
  a semiconductor substrate of a first conductive type made of a semiconductor having a bandgap wider than silicon;
  a drift region of the first conductive type, made of said semiconductor, over the semiconductor substrate;
  one or more first MOS gate structures at or adjacent to a top surface of the drift region, each of the first MOS gate structures including:
    a gate electrode,
    a gate insulating film,
    a source region of the first conductivity type, made of said semiconductor, and
    a channel region of a second conductivity type, made of said semiconductor, the channel region being disposed across the gate electrode with the gate insulating film interposed therebetween, and being in contact with the source region on one end and the drift region on another end alongside the gate insulating film, so that when a potential difference between the gate electrode and the channel region exceeds a threshold voltage, an inversion region would be created in the channel region to form a channel between the source region and the drift region;
  one or more second MOS gate structures in the top surface of the drift region, each of the second MOS gate structures including:
    a gate electrode,
    a gate insulating film,
    a source region of the first conductivity type, made of said semiconductor, and
    a channel region of a second conductivity type, made of said semiconductor, the channel region being disposed across the gate electrode with the gate insulating film interposed therebetween, and being in contact with the source region on one end and the drift region on another end alongside the gate insulating film, so that when a potential difference between the gate electrode and the channel region exceeds a threshold voltage, an inversion region would be created in the channel region to form a channel between the source region and the drift region;

a source electrode over the first and second MOS gate structures, the source electrode being electrically connected to the source region of each of the first and second MOS gate structures; and a drain electrode under the semiconductor substrate, wherein the first MOS gate structures and the second MOS gate structures are arranged side-by-side in a plan view and when the first and second MOS gate structures are both provided in a plurality, a group consisting of a prescribed number of the first MOS gate structures and a prescribed number of the second MOS gate structures that are arranged in a prescribed arrangement is repeatedly arranged in the plan view, and wherein at least one of physical properties of the respective gate electrodes, the respective gate insulating films, and the respective channel regions of the first and second MOS structures is made different between the first MOS structure and the second MOS structure such that the threshold voltage of each of the first MOS gate structures is greater than the threshold voltage of each of the second MOS gate structures.

2. The semiconductor device according to claim 1, wherein a thickness of the gate insulating film of the second MOS gate structure is less than a thickness of the gate insulating film of the first MOS gate structure.

3. The semiconductor device according to claim 1, wherein at least a portion of the gate insulating film of the second MOS structure has a higher dielectric constant than the gate insulating film of the first MOS gate structure.

4. The semiconductor device according to claim 1,
wherein the first conductivity type is n-type,
wherein the second conductivity type is p-type, and
wherein a material of the gate electrode of the second MOS gate structure has a higher Fermi level than a material of the gate electrode of the first MOS gate structure.

5. The semiconductor device according to claim 4,
wherein the material of the gate electrode of the first MOS gate structure is p-type polysilicon, and
wherein the material of the gate electrode of the second MOS gate structure is n-type polysilicon.

6. The semiconductor device according to claim 1,
wherein the first conductivity type is p-type,
wherein the second conductivity type is n-type, and
wherein the material of the gate electrode of the second MOS gate structure has a lower Fermi level than the material of the gate electrode of the first MOS gate structure.

7. The semiconductor device according to claim 6,
wherein the material of the gate electrode of the first MOS gate structure is n-type polysilicon, and
wherein the material of the gate electrode of the second MOS gate structure is p-type polysilicon.

8. The semiconductor device according to any one of claim 1, wherein each of the first and second MOS gate structures further includes a JFET region that is a portion of the drift region, wherein each of the first and second MOS gate structures is a planar gate structure in which the source region, the channel region, and said JFET region of the drift region are arranged laterally, and the gate electrode is disposed laterally via the gate insulating film over the source region, the channel region and said JFET region of the drift region, and wherein a width of said JFET region of the second MOS gate structure is narrower than a width of said JFET region of the first MOS gate structure.

9. The semiconductor device according to claim 1,
wherein each of the first and second MOS gate structures is a trench gate structure in which the gate insulating film and the gate electrode are disposed in a trench that extends vertically from a top towards a bottom, and the source region, the channel region, and said JFET region of the drift region are arranged vertically alongside the trench, wherein each of the first and second MOS gate structures further includes:

a first semiconductor region of the second conductivity type that is selectively disposed inside the drift region so as to be separated from the channel region and surround a bottom surface of the trench;

a second semiconductor region of the second conductivity type, selectively disposed inside the drift region, between the adjacent trenches, and contacting the channel region; and a JFET region that is a portion of the drift region interposed between the first semiconductor region and the second semiconductor region, and wherein a width of said JFET region of the second MOS gate structure is narrower than a width of said JFET region of the first MOS gate structure.

10. The semiconductor device according to claim 1, wherein the gate electrode of each of the second MOS gate structures is connected to the source electrode of the second MOS gate structure to have a potential fixed to a potential of the source electrode.

11. The semiconductor device according to claim 1,
wherein each of the first and second MOS gate structures further includes a contact region of the second conductivity type that is selectively disposed in the channel region so as to contact the source region and has a higher impurity concentration than the channel region, and wherein the contact region is in contact with the source electrode, and a contact area between the source electrode and the contact region is less than or equal to $\frac{1}{10}$ of a contact area between the source electrode and the source region.

12. The semiconductor device according to claim 11,
wherein each of the first and second MOS gate structures further includes another electrode that forms a Schottky junction with the channel region, and wherein the source electrode forms an ohmic junction with the contact region.

13. The semiconductor device according to claim 1,
wherein a plurality of the first and second MOS gate structures are arranged in parallel in a growth direction of belt shape stacking faults in said semiconductor.

* * * * *